(12) United States Patent
Furukawa

(10) Patent No.: US 6,654,916 B1
(45) Date of Patent: Nov. 25, 2003

(54) WAVEFORM GENERATOR, SEMICONDUCTOR TESTING DEVICE AND SEMICONDUCTOR DEVICE

(75) Inventor: Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/394,525

(22) Filed: Sep. 10, 1999

(30) Foreign Application Priority Data

Jul. 30, 1999 (JP) .......................... H11-218235
Sep. 11, 1999 (JP) .......................... H10-258219

(51) Int. Cl.[7] .............................. G01R 31/28
(52) U.S. Cl. ........................ 714/724; 714/815
(58) Field of Search ............... 714/724, 718, 714/815, 731, 733, 734; 327/276

(56) References Cited

U.S. PATENT DOCUMENTS

| | | | |
|---|---|---|---|
| 4,497,056 A | 1/1985 | Sugamori | 371/25 |
| 5,144,255 A | 9/1992 | Malka et al. | |
| 5,406,132 A * | 4/1995 | Housako | 327/172 |
| 5,574,733 A | 11/1996 | Kim | 371/27 |
| 5,589,788 A | 12/1996 | Goto | 327/276 |

FOREIGN PATENT DOCUMENTS

| | | |
|---|---|---|
| GB | 895201 | 5/1962 |
| GB | 2 305 082 | 3/1997 |
| GB | 2 305 082 A | 3/1997 |
| WO | WO 97/04525 | 2/1997 |

OTHER PUBLICATIONS

German Official Action, dated Jul. 3, 2002, 9 pages.

* cited by examiner

*Primary Examiner*—Phung M. Chung
(74) *Attorney, Agent, or Firm*—Rosenthal & Osha L.L.P.

(57) ABSTRACT

A waveform generation circuit 16 comprises an input terminal 28, a composing unit 21, a delay unit 23, a processing unit 25, a memory unit 27 and an output terminal 52. The predetermined pulse enters the input terminal 28 as an input signal. The delay unit 23 comprises a plurality of consecutively numbered delay elements 30, 31, . . . to 314 which delays the propagation of the input signal. The processing unit 25 has a plurality of processing means, each of that can output a delayed signal. The composing unit 21 composes said delayed signals so that an output waveform is generated.

21 Claims, 26 Drawing Sheets

(1) PULSE INPUT (2) OUTPUT WAVEFORMa    00

(3) OUTPUT WAVEFORMb    01

(4) OUTPUT WAVEFORMc:   10
    DATA

|  | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| FIRST ROW | 1 | 1 | 0 | 0 | 0 | 0 | 0 | 0 | 0 | 0 | 0 | 0 | 0 | 0 | 0 | 0 |
| SECOND ROW | 0 | 1 | 1 | 1 | 0 | 0 | 0 | 0 | 0 | 0 | 0 | 0 | 0 | 0 | 0 | 0 |
| THIRD ROW | 0 | 0 | 0 | 0 | 0 | 1 | 0 | 1 | 0 | 0 | 0 | 0 | 0 | 0 | 0 | 0 |
| FOURTH ROW | 1 | 0 | 0 | 1 | 0 | 0 | 0 | 0 | 0 | 1 | 0 | 0 | 0 | 0 | 0 | 0 |

*Fig. 10*

WAVEFORM GENERATOR, SEMICONDUCTOR TESTING DEVICE AND SEMICONDUCTOR DEVICE

This patent application claims priority based on a Japanese patent applications, H10-258219 filed on Sep. 11, 1998 and H11-218235 filed on Jul. 30, 1999, the contents of which are incorporated herein by reference.

DETAILED DESCRIPTION OF THE INVENTION

The present invention relates to a waveform generator capable of generating an arbitrary waveform, and more specifically to a waveform generator capable of generating an arbitrary waveform having a short time resolution.

In order to test a device such as an LSI, an arbitrary waveform generator capable of generating arbitrary waveforms is necessary.

FIGS. 1 and 2 show examples of conventional arbitrary waveform generators. FIG. 1 is a block diagram of a conventional arbitrary generator 200. FIG. 2 is a circuit diagram of a waveform generation circuit from a conventional arbitrary waveform generator.

The arbitrary waveform generator 200 is comprised of a digital signal processor (DSP) 202 having a memory, a waveform memory 204 for storing data for generating output waveforms, a full-scale digital to analog converter (full-scale DAC) 205, an off-set digital to analog converter (off-set DAC) 206, a waveform generation digital to analog converter (waveform generation DAC) 208 for generating an arbitrary waveform, a low-pass filter (LPF) 210, an amplifier 212 and a clock control unit 214. The waveform memory 204, the full-scale DAC 205 and the off-set DAC 206 are connected to the DSP 202 respectively. The waveform generation DAC 208 is connected to the waveform memory 204. The LPF 210 is connected to the waveform generation DAC 208 and the amplifier 212 is couple to the LPF 210.

The full-scale DAC 205 serves to determine the output voltage value on the basis of a digital value stored in the waveform memory 204. The output signal from the full-scale DAC 205 is output to the waveform generation DAC 208.

The off-set DAC 206 serves to adjust the output voltage value to zero when the signal value stored in the waveform memory 204 is a "0" code. The output signal from the off-set DAC 206 is output to the amplifier 212. The clock control unit 214 serves to synchronize the waveform generator 200.

Referring to FIG. 2, the waveform generation DAC 208 comprises 5 current sources 221, 222, . . . to 225, with each capable of outputting predetermined current values. The current switches 231, 232, . . . to 235 are held in communication with each other through an output line. Each of the current sources 221, 222, . . . to 225 is cascaded to each of the respective current switches 231, 232, . . . to 235. One end of the output line is connected to the ground through a resistance 241 and the other end of the output line is connected to an output terminal.

Each of the respective current sources has an ability to output a current half of the previous current sources value. For example, the current source 221 is capable of outputting current with a value of I, while current source 222 is capable of outputting current of value I/2. It follows that current sources 223, 224 and 225 are capable of outputting current with values of I/4, I/8 and I/16 respectively. This means that the current switch 231 is the most significant bit (MSB) and the current switch 235 is the least significant bit (LSB). The current switches 231, 232, . . . to 235 are switched on and off by the input data from the waveform memory 204. For example, when the input data from the waveform memory 204 is "00101", the currect switches 233 and 235 are switched on to output current having a current value of (I/4+I/16). The current is output to the output terminal via the resistance 241 to give an output signal (I/4+I/16)×R. The full-scale DAC 205 determines the actual values of the current value I.

The waveform generator 200 can generate an arbitrary waveform by switching on and off the current switches in accordance with the input data from the waveform memory 204.

The time resolution of the waveform generated by the conventional waveform generator described above is determined by the operational speed of the current switches 231, 232, . . . to 235. The current switches 231, 232, . . . to 235 are operated at 1 GHz frequency. This means that the conventional waveform generator can generate a waveform having a time resolution as short as 1 nsec.

The conventional waveform generator therefore cannot generate a waveform having a shorter time resolution than 1 nsec although there are applications where this may be required. For example, it is necessary to use an arbitrary waveform having a time resolution as short as 8 GHz sampling/sec to test an AC characteristic of a device for high speed interface such as a 1 GHz Ethernet (registered trademark). The conventional waveform generator is therefore unsuitable for this application as it cannot generate an arbitrary waveform with a time resolution of more than 1 GHz due to the speed limitation of the current switches 231, 232, . . . to 235.

SUMMARY OF THE INVENTION

It is an object of the present invention to provide a waveform generator capable of generating an arbitrary waveform with an adequately short time resolution to solve problems similar to that described above. It is another object of the present invention to provide a semiconductor testing device and a semiconductor device both including the waveform generator.

The waveform generator comprises an input terminal to which an input signal is input; a delay unit having a plurality of delay means for delaying propagation of the input signal to output a delayed input signal, the delay means being cascaded with each other; a processing unit having a plurality of processing means, each of the processing means outputting an output signal based on each of the delayed input signal input thereto; and a composing unit for composing the output signals from each of the processing means of the processing unit to generate a waveform.

The waveform generator may also comprise a plurality of the delay units connected to the input terminal in parallel relationship with each other; and a plurality of the processing units correspondingly provided to each of the plurality of delay units. The composing unit adds the output signals from each of the processing means to give a sum total value and generates the waveform on the basis of this total value. The processing unit comprises processing means into which the input signal is fed to the input terminal.

The waveform generator may further comprise a plurality of memory for storing data for generating the waveform, each of which is connected to each of the respective plurality of processing means. Each of the processing means outputs the output signal on the basis of the data for generating the waveform stored in each of the memory.

The processing means may either directly output the delayed input signal or outputs after reversing the delayed input signal as the output signal on the basis of the data for generating the waveform. The memory of the waveform generator may store a plurality of data for generating the waveform, and the processing means outputs the output signal on the basis of the plurality of data stored in the memory. The result is the waveform generated comprises a longer period wave than the input signal.

The waveform generator may also contain a data control unit for controlling the plurality of data for generating the waveform to be output at a predetermined interval and the processing means outputting the output signal on the basis of the data for generating the waveform output by the data control unit. The delay unit may include first and last delay means each having an input and an output, the input of the first delay means being connected to the input terminal, and the output of the last delay means being connected to the input of the first delay means. The processing means may output the output signal on the basis of the input signal and the data for generating the waveform stored in the memory means. The composing unit generates a pulse having a predetermined pulse width as the waveform on the basis of the output signal.

The processing means may output the output signal on the basis of the input signal, the data for generating the waveform stored in the memory means, and the delayed input signal delayed for a predetermined duration. The composing unit may generate a pulse having a predetermined pulse width as the waveform on the basis of the output signal. Each of the processing means may output current with the same value as the output signal.

The composing unit may compose the output signal from each of the processing means to generate the waveform having a value corresponding to the number of the processing means. Each of the processing means comprises a current supply circuit for supplying current on the basis of the output signal and a reverse signal of the output signal. The waveform generator may further contain a minute delay element provided between the input terminal and the first delay means, the minute delay element having a smaller delay duration than that of the delay means. Additionally it may contain a plurality of minute delay elements each provided between the input terminal and the first delay means of each of the delay units, the minute delay element having a smaller delay duration than that of the delay means.

The semiconductor testing device may comprise a waveform generator for generating on the basis of an input signal, a test signal to be input to the device under test; a signal input and output unit for supplying the test signal to the device under test and accepting a device output signal from the device under test on the basis of the test signal; and a testing unit for testing the quality of the device under test on the basis of the device output signal accepted by the signal input and output unit. The waveform generator may comprise an input terminal to which an input signal is input; a delay unit having a plurality of delay means for delaying propagation of the input signal to output a delayed input signal, the delay means being cascaded with each other; a processing unit having a plurality of processing means, each of the processing means outputting an output signal based on each of the delayed input signals thereto; and a composing unit for composing the output signals from each of the processing means of the processing unit to generate a waveform of the test signal.

The waveform generator comprises; a plurality of the delay units connected to the input terminal in parallel relationship with each other; and a plurality of the processing units correspondingly provided to each of the plurality of delay units. The semiconductor testing device may have a composing unit which adds the output signals from each of the processing means to give a summed total value, and generates the waveform on the basis of this total value. The waveform generator may further comprise a plurality of memory for storing data for generating the waveform, each of the plurality of memory respectively being connected to each of the plurality of processing means, each of the processing means outputting the output signal on the basis of the data for generating the waveform stored in each of the memory.

The semiconductor device having self-testing ability comprises a device circuit constructed to actualize a predetermined function; a waveform generation circuit for generating a test signal to be input to the device circuit; and a signal output unit for outputting a device output signal from the device circuit on the basis of the test signal, to the external of the semiconductor device. The waveform generation circuit may comprise a delay !unit having a plurality of delay means for delaying the propagation of an input signal to output a delayed input signal, the delay means being cascaded with each other; a processing unit having a plurality of processing means, each of the processing means outputting an output signal based on each of the delayed input signals input thereto; and a composing unit for composing the output signals from each of the processing means of the processing unit to generate a waveform of the test signal.

The waveform generation circuit may comprise; a plurality of the delay units connected in parallel relationship with each other; and a plurality of the processing units correspondingly provided to each of the plurality of delay units. The composing unit adds the output signals from each of the processing means to give a sum total value and generates the waveform on the basis of this total value. The waveform generation circuit may further comprise a plurality of memory for storing data for generating the waveform, where each of the plurality of memory is connected to each of the plurality of processing means, and each of the processing means outputting the output signal on the basis of the data for generating the waveform stored in each of the memory.

BRIEF DESCRIPTION OF THE DRAWINGS

FIG. 10 shows examples of data for generating the waveform stored in the waveform generation circuit of a third embodiment of the waveform generator according to the present invention;

PREFERRED EMBODIMENT OF THE INVENTION

First Embodiment

Figure 1:
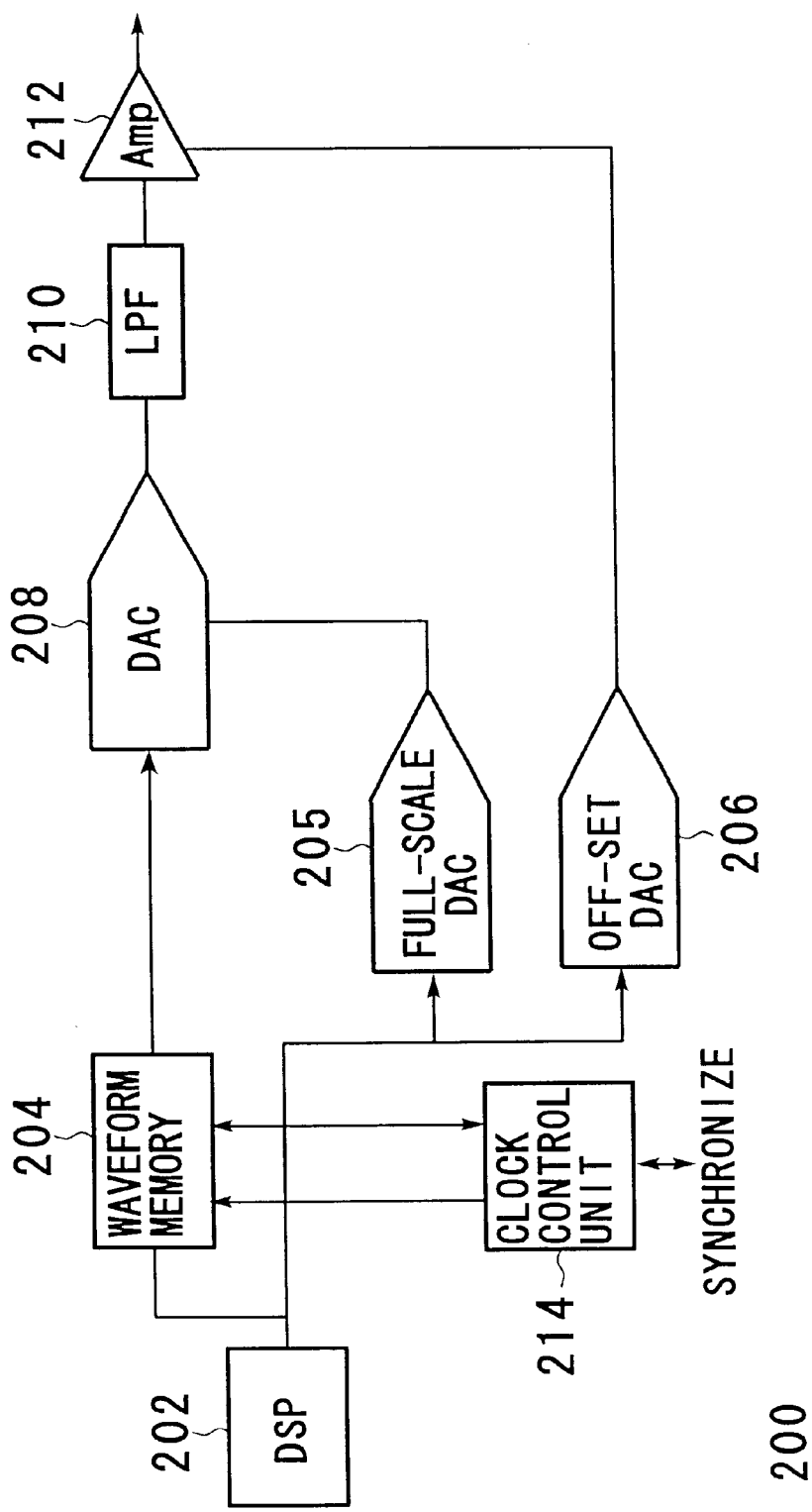
FIG. 1 is a block diagram of a conventional arbitrary waveform generator.
Figure 2:
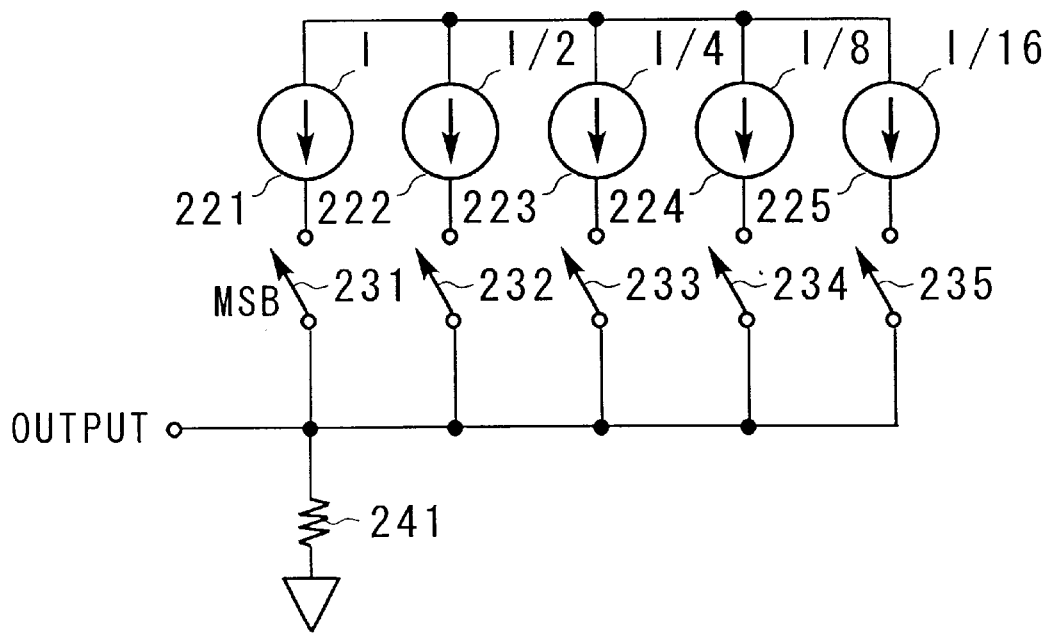
FIG. 2 is a circuit diagram of the conventional arbitrary waveform generator.
Figure 3:
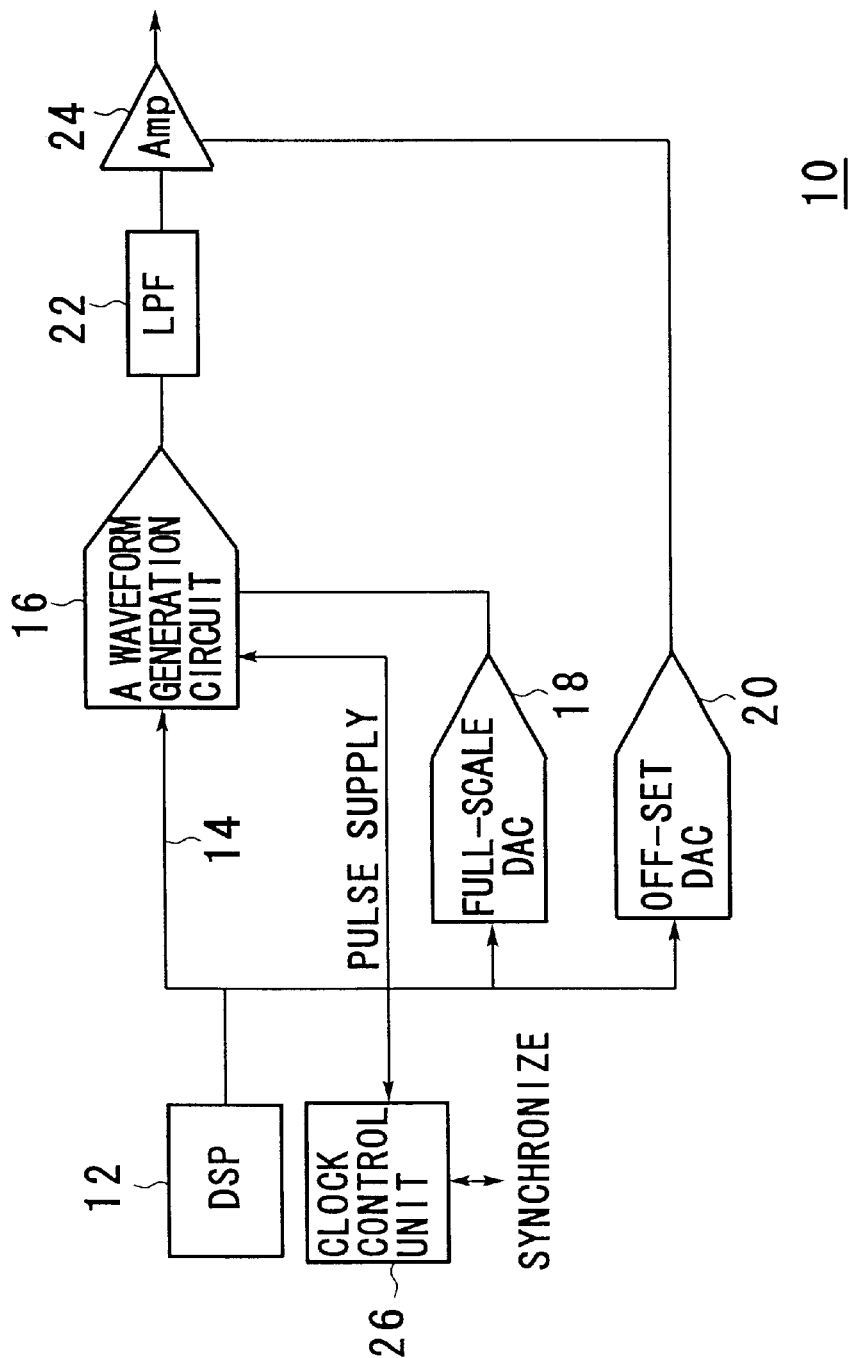
FIG. 3 is a block diagram of a first embodiment of the arbitrary waveform generator according to the present invention.
Figure 4:
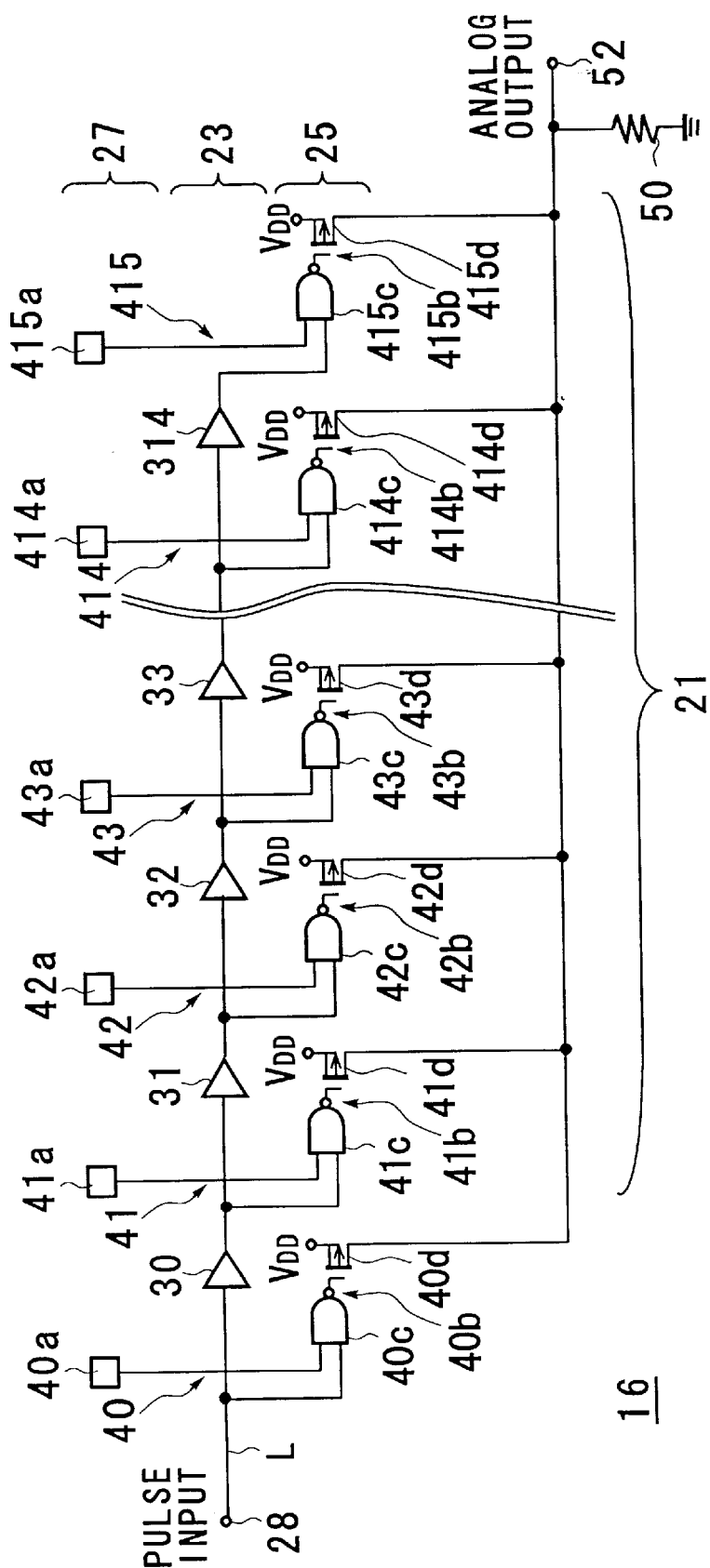
FIG. 4 is a circuit diagram of a waveform generation circuit of a first embodiment of the arbitrary waveform generator according to the present invention.

The first embodiment of the arbitrary waveform generator according to the present invention will be explained with reference to FIGS. 3 to 5. FIG. 3 shows a block diagram of the first embodiment of the arbitrary waveform generator. FIG. 4 shows a circuit diagram of the first embodiment of the arbitrary waveform generator.

The arbitrary waveform generator 10, shown in FIG. 3, comprises a digital signal processor (DSP) 12 having memory, a control bus 14, a waveform generation circuit 16, a full-scale digital to analog converter (full-scale DAC) 18, an off-set digital to analog converter (off-set DAC) 20, a low-pass filter (LPF) 22, an amplifier 24 and a clock control unit 26. The waveform generation circuit 16, the full-scale DAC 18 and the off-set DAC 20 are connected respectively to the DSP 12 through the control bus 14. The LPF 22 is connected to the waveform generation circuit 16 and the amplifier 24 is connected to the LPF 22. The full-scale DAC 18 serves to determine the output voltage value on the basis of an input digital value. The off-set DAC 20 adjusts the voltage value so that the output signal from the amplifier 24 has a center axis of zero.

The clock control unit 26 serves to synchronize the waveform generator 10 and supply a predetermined pulse to the waveform generation circuit 16. The waveform generation circuit 16, shown in FIG. 4, comprises an input terminal 28, a composing unit 21, a delay unit 23, a processing unit 25, a memory unit 27 and an output terminal 52. The predetermined pulse from the clock control unit 26 enters the input terminal 28 as an input signal. The delay unit 23 comprises a plurality of consecutively numbered delay elements 30, 31, ... to 314 which delays the propagation of the input signal. In this embodiment, the delay elements 30, 31 ... to 314 are cascaded with each other and the first delay element 30 is connected to the input terminal 28.

There are provided sixteen circuit elements 40, 41, ... to 415 respectively between the input terminal 28 and the first delay element 30, the two adjacent delay elements 30, 31 ... to 314, and between the last delay element 314 and the output terminal 52. Each of the circuit elements 40, 41, ..., to 415 respectively are comprised of one memory element 40a, 41a, ... to 415a and one processing circuit 40b, 41b, ... to 415b. The memory elements 40a, 41a, ... to 415a together compose the memory unit 27, and the processing circuits 40b, 41b ... to 415b combine to compose the processing unit 25. Each of the processing circuits 40b to 415b are comprised of the respective NAND gate 40c, 41c ... to 415c and the respective P channel field effect transistors 40d, 41d ... to 415d.

Each of the NAND gates 40c, 41c, ... to 415c comprises two input terminals and an output terminal. Each of the P channel field effect transistors 40d, 41d ... to 415d is comprised of an input gate, source and drain. The NAND gates 40c, 41c, ... to 415c are connected to the respective memory elements 40a to 415a through one of the input terminals, and connected to the input signal line L through the other input terminal. The NAND gates 40c, 4.1c, ... to 415c are connected to the P channel field effect transistors 40d, 41d ... to 415d through the output terminals of the NAND gates 40c to 415c and the input gates of the P channel field effect transistors 40d, 41d ... to 415d, respectively. The power source voltage VDD is applied to the source of each of the P channel field effect transistors 40d, 41d ... to 415d. The drains of the P channel field effect transistors 40d, 41d ... to 415d are connected to the composing unit 21 and held in communication with each other. The composing unit 21 is connected to the ground via a resistance 50.

The processing circuit 40b produces an output signal on the basis of the signal fed to the input terminal 28 supplied by the processing circuit 40b. The delay elements 30, 31 . . . to 314 delay the propagation of the signal fed to the input terminal 28. Each of the processing circuits 41b, 42b . . . to 415b emits an output signal on the basis of the respective delayed input signal supplied. The composing unit 21 is comprised of a signal line connecting the drains of the P channel field effect transistors 40d, 41d . . . to 415d with each other, and a resistance 50 connecting the signal line to ground. The output signals for this unit connect from each of the processing circuits 40b, 41b, . . . to 415b of the processing unit 25 to generate a waveform. The analog output signal composed by the composing unit 21 is output from the output terminal 52.

Digital data for generating the waveform is transferred from the DSP 12 to each of the memory elements 40a, 41a . . . to 415a of each of the circuit elements 40, 41 . . . to 415 respectively. This is transferred through the control bus 14 and stored therein. The plurality of memory elements 40a, 41a . . . to 415a compose the memory unit 27. The data for generating the analog signal waveform output from terminal 52 is composed by the composing unit 21.

The memory elements 40a, 41a . . . to 415a correspond with the respective processing circuits 40b, 41b . . . to 415b. Each of the processing circuits 40b, 41b . . . to 415b produces an output signal based on the data for generating the waveform stored in the corresponding memory elements 40a, 41a . . . to 415a, respectively. The signal "L" (logical value zero) turns on the P channel field effect transistors 40d, 41d . . . to 415d. At this time, each of the P channel field effect transistors 40d, 41d . . . to 415d equally produce a saturated drain currency as the output signal. In contrast, the signal "H" (logical value 1) turns off the P channel field effect transistors 40d, 41d . . . to 415d resulting in no output of signal at this time.

The composing unit 21 is a current adding circuit adding the output signals (which are current) to give a composed value. It then generates the waveform of the analog output signal on the basis of the composed value. When the value of the output signal from each of the P channel field effect transistors 40d, 41d . . . to 415d is equal, the waveform composed by the composing unit 21 has the value corresponding to the number of the processing circuits outputting signal at that moment.

The signal output from the full-scale DAC 18 controls the voltage value of the power source voltage VDD to determine the full-scale voltage value of the output waveform. The off-set signal output from the off-set DAC 20 is input to the amplifier 24 so that the output signal from the amplifier 24 has a center axis of zero.

Figure 5:
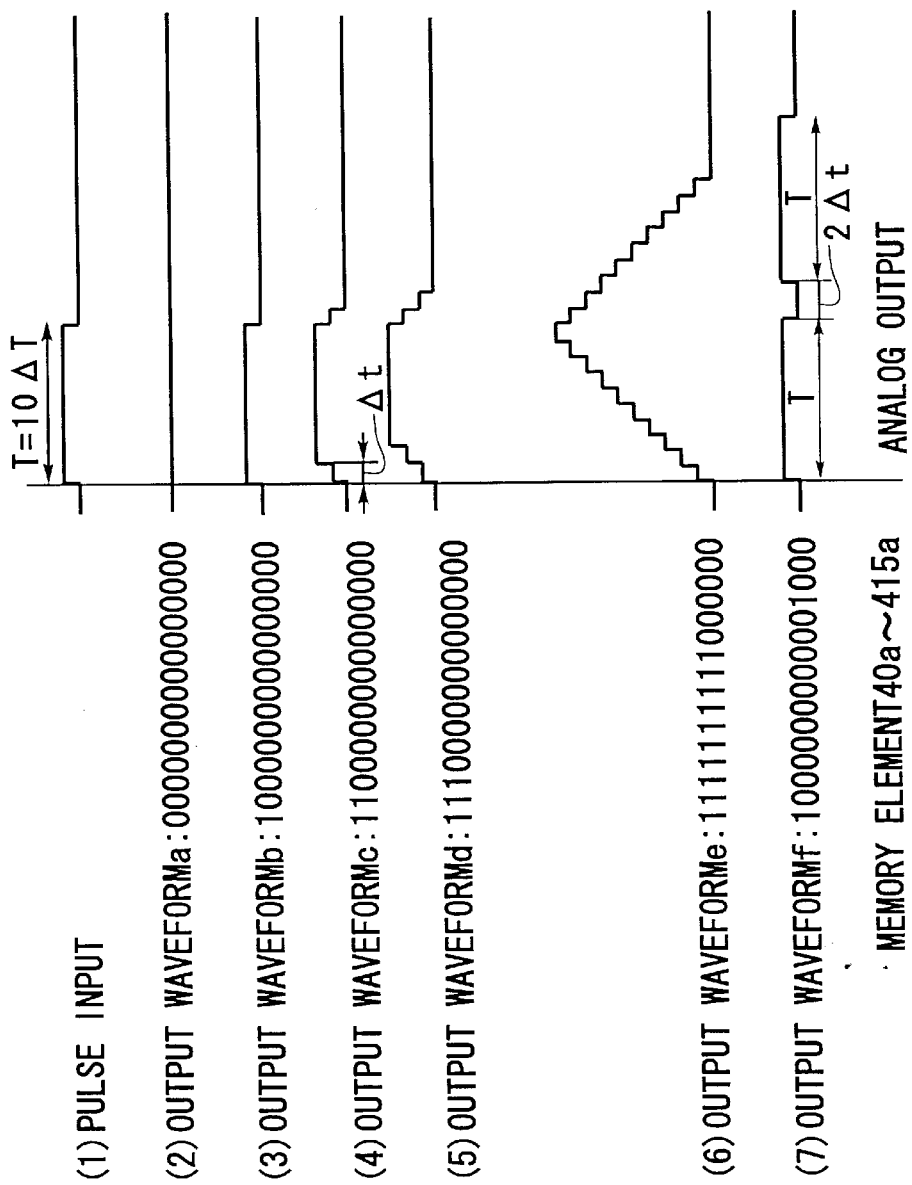
FIG. 5 shows examples of waveforms generated by the waveform generation circuit of a first embodiment of the waveform generator according to the present invention.

FIG. 5 shows examples of the waveform generated by the arbitrary waveform generator according to the first embodiment of the present invention.

The delay elements 30, 31 . . . to 314 of the waveform generation circuit 16 delay the propagation of the input signal for delay duration $\Delta T$. This is shorter than the pulse width T of the input pulse in this example. The pulse width T of the input pulse, shown in FIG. 5 (1), is 10 times as long as the delay duration $\Delta T$ of each of the delay elements 30, 31 . . . to 314.

When the memory elements 40a, 41a . . . to 415a store "0000000000000000", where all the bits are zero, the analog output waveform "a" does not change from the value zero as shown in FIG. 5 (2). When the memory elements 40a, 41a . . . to 415a store "1000000000000000", where only the first bit (the circuit element 40) is 1 and the rest are zero, the circuit element 40 outputs the input pulse. The rest of the circuit elements 41, 42 . . . to 415 do not output the input pulse. This gives the analog output waveform "b" being single pulse as shown in FIG. 5 (3).

When the memory elements 40a, 41a . . . to 415a store "1100000000000000", where the first and second bits (the circuit elements 40 and 41) are 1 and the rest are zero, the circuit element 40 outputs the input pulse without any delay duration. The circuit element 41 outputs the input pulse with the delay duration $\Delta T$. The rest of the circuit elements 42 . . . to 415 do not output the input pulse. This gives the analog output waveform "c" being two pulses overlapped as shown in FIG. 5 (4). The pulse width of each of the pulses is as same as the pulse width T of the input pulse.

When the memory elements 40a, 41a . . . to 415a; store "1110000000000000" , where the first to third bits (the circuit elements 40, 41 and 42) are 1 and the rest are zero, the circuit element 40 outputs the input pulse without any delay duration. The circuit element 41 outputs the input pulse with the delay duration $\Delta T$, and the circuit element 42 outputs the input pulse with the delay duration $2\Delta T$. The remainder of the circuit elements 43, . . . , 415 do not output the input pulse. This gives the analog output waveform "d" being three pulses overlapped , each of which is shifted $\Delta T$ as shown in FIG. 5 (5). The pulse width of each of the pulses is the same as the pulse width T of the input pulse.

When the memory elements 40a, 41a. . . . . . to 415a store "1111111111000000", where the first to tenth bits (the circuit elements 40, 41, . . . to 49) are 1 and the rest are zero, the circuit element 40 outputs the input pulse without any delay duration. The circuit element 41 outputs the input pulse with the delay duration $\Delta T$, and each of the circuit element 42, . . . , 49 outputs the input pulse with the delay duration $\Delta 2T, \ldots, \Delta 9T$, respectively. The rest of the circuit elements 410 , . . . , 415 do not output the input pulse. This gives the analog output waveform "e" being ten pulses overlapped to produce a triangle shaped waveform each of which is shifted $\Delta T$ as shown in FIG. 5 (6). The pulse width of each of the pulses is as same as the pulse width T of the input pulse.

When the memory elements 40a, 41a . . . to 415a store "1000000000001000", where the first and the thirteenth bits (the circuit elements 40 and 412) are 1 and the rest are zero, the circuit element 40 outputs the input pulse without any delay duration. The circuit element 412 outputs the input pulse with the delay duration $12\Delta T$ (=T+$2\Delta T$). The rest of the circuit elements 41, . . . , 415 do not output the input pulse. This gives the analog output waveform "f" being two separated pulses with $2\Delta T$ intervals as shown in FIG. 5 (7).

As described above, the waveform generator of the first embodiment according to the present invention can generate an arbitrary waveform having a time resolution $\Delta T$. This is a delay duration of each of the delay elements 30, 31 . . . to 314 by changing the data stored in each of the memory elements 40a, 41a . . . to 415a. Although the limitation of the input pulse width T is as short as 1 nsec with the current technology, the delay duration $\Delta T$ of each of the delay elements 30, 31 . . . to 314 becomes $\frac{1}{10}$ of the pulse width T, which is 10 psec to 100 psec. Therefore, the waveform generator of the first embodiment according to the present invention can generate an arbitrary waveform having extremely short time resolution which cannot be generated by conventional waveform generators.

Furthermore, the waveform generator of the first embodiment according to the present invention can generate an arbitrary waveform having an arbitrary time resolution. This is achieved by changing the pulse width T of the input pulse, delay duration $\Delta T$ of each of the delay elements 30, 31 . . .

to 314, and the number of bits of each of the circuit elements 40, 41 . . . to 415.

Second Embodiment

Figure 6:
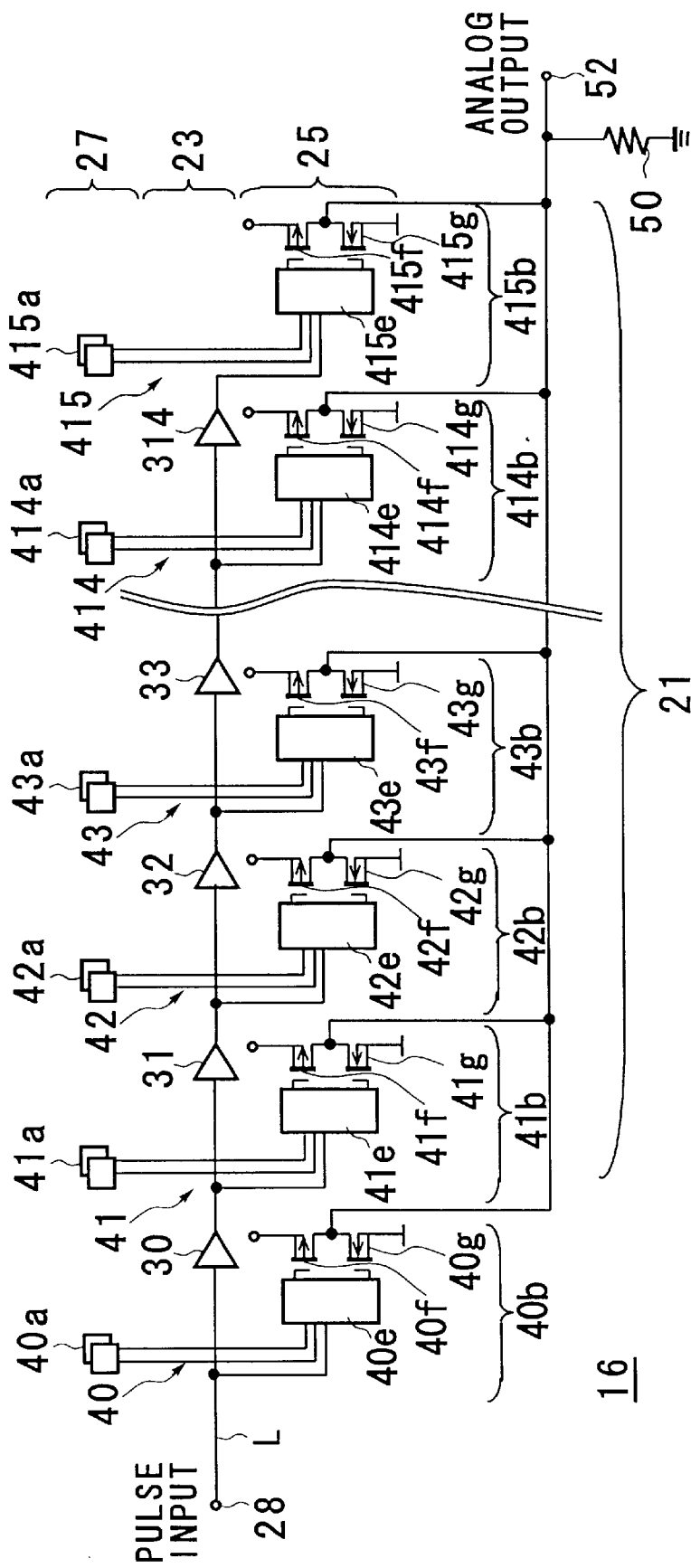
FIG. 6 is a circuit diagram of a waveform generation circuit of a second embodiment of the arbitrary waveform generator according to the present invention.
Figure 7:
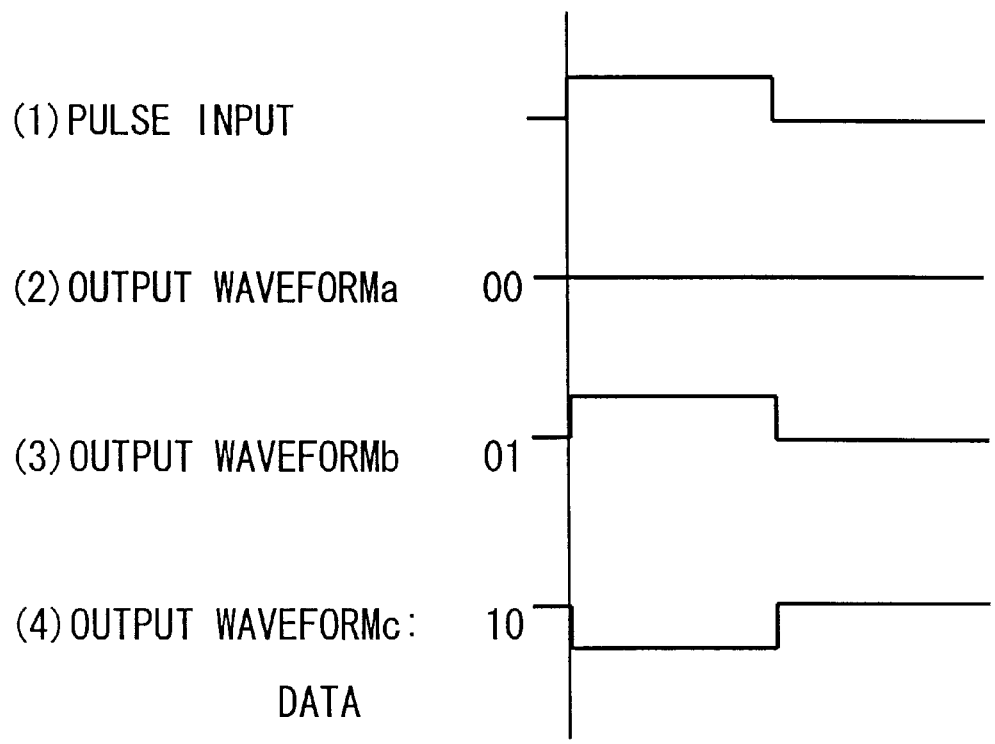
FIG. 7 shows examples of waveforms generated by the waveform generation circuit of the second embodiment of the waveform generator according to the present invention.

The second embodiment of the arbitrary waveform generator according to the present invention will be explained with reference to FIGS. 6 to 8. FIG. 6 shows a circuit diagram of the second embodiment of the arbitrary waveform generator. The arbitrary waveform circuit 16 is comprised of an input terminal 28, a composing unit 21, a delay unit 23, a processing unit 25, a memory unit 27 and an output terminal 52. The predetermined input signal pulse from the clock control unit 26 enters the input terminal 28. The delay unit 23 is comprised of numerous delay elements 30, 31 . . . to 314, which are cascaded with each other with the first delay element 30 connected to the input terminal 28.

The processing unit 25 is comprised of a plurality of processing circuits 40b, 41b . . . to 415b, while the memory unit 27 is comprised of a plurality of memory elements 40a, 41a . . . to 415a. The composing unit 21 is comprised of a signal line connecting the outputs of the processing circuits 40b, 41b . . . to 415b with each other, and a resistance 50 connecting the signal line to ground. The elements or parts of the waveform generator of the second embodiment which are same as or similar to those of the first embodiment shown in FIGS. 3 and 4 have the same numerals as these figures. The explanation of those elements or parts will therefore be simplified or omitted.

In this embodiment, fifteen of the delay elements 30, 31 . . . to 314 are cascaded with each other. The first delay element 30 is connected to the input terminal 28 to which a predetermined pulse is input from the clock control unit 26, as shown in FIG. 6. There are sixteen circuit elements 40, 41 . . . to 415 respectively between the following components: the input terminal 28 and the first delay element 30; the two adjacent delay elements 30, 31 . . . to 314; and the last delay element 314 and the output terminal 52.

Each of the circuit elements 40, 41 . . . to 415 respectively is comprised one of 2 bits memory elements 40a, 41a . . . to 415a and one of processing circuits 40b, 41b . . . to 415b. Each of the processing circuits 40b, 41b . . . to 415b respectively is comprised one of gate circuits 40e, 41e . . . to 415e, one of P channel field effect transistors 40f, 41f . . . to 415f, and one of N channel field effect transistors 40g, 41g . . . to 415g. Each of the P channel field effect transistors 40f, 41f . . . to 415f, and each of the N channel field effect transistors 40g, 41g . . . to 415g respectively is comprised of an input gate, source and drain.

Each of the gate circuits 40e, 41e . . . to 415e is comprised of first to third input terminals and first and second output terminals. Each of the gate circuits 40e, 41e . . . to 415e is connected to the respective 2 bit memory elements 40a, 41a . . . to 415a through its first and second input terminals and connected to the input signal line L through its third input terminal. Each of the gate circuits 40e, 41e . . . to 415e is connected to the respective P channel field effect transistors 40f, 41f . . . to 415f through its first output terminal, and connected to each of the N channel field effect transistors 40g, 41g . . . to 415g through its second output terminal.

The positive power source voltage VDD is applied to the source of each of the P channel field effect transistors 40f, 41f . . . to 415f. The negative power source voltage VSS is applied to the source of each of the N channel field effect transistors 40g, 41g . . . to 415g. The drains of each of the P channel field effect transistors 40f, 41f . . . to 415f and each of the N channel field effect transistors 40g, 41g . . . to 415g are connected with the respective partner and ground via a resistor. This means that each of the processing circuits 40b, 41b . . . to 415b are connected with each other through the drains of each of the P channel field effect transistors 40f, 41f . . . to 415f and each of the N channel field effect transistors 40g, 41g . . . to 415g. These are then connected to ground via the resistance 50. The output terminal 52 outputs an analog output signal.

Digital data for generating the waveform is transferred from the DSP 12 to each of the 2 bit memory elements 40a, 41a . . . to 415a of each of the circuit elements 40, 41 . . . to 415. This is done through the control bus 14 where the respective data is also stored. The output signal from the full-scale DAC 18 controls the voltage value of the power source voltage VDD and VSS. This determines the full-scale positive and negative voltage values of the output waveform.

The output waveforms output from each of the processing circuits 40b, 41b . . . to 415b will be explained with reference to FIG. 7. Each of the processing circuits 40b, 41b . . . to 415b determines one way from among three possible on the basis of the data stored in each of the 2 bit memory elements 40a, 41a . . . to 415a. The possibilities are no output of the input pulse, output of the input pulse without reversing it, or output of the input pulse after reversing it.

When the data stored in each of the memory elements 40a, 41a . . . to 415a is (00), the logical values zero are input to the first and second input terminals of each of the gate circuits 40e, 41e . . . to 415e. Even if the pulse is input to the third input terminal of each of the gate circuits 40e, 41e . . . to 415e, the first output terminal of each of the gate circuits 40e, 41e . . . to 415e outputs "H (logical value 1)" to the gate of each P channel field effect transistor 40f, 41f . . . to 415f. Additionally, the second output terminal of each gate circuit 40e, 41e . . . to 415e outputs "L (logical value zero)" to the gate of each N channel field effect transistor 40g, 41g . . . to 415g. As a result, each of the processing circuits 40b, 41b . . . to 415b outputs signal having zero level.

When the data stored in each of the memory elements 40a, 41a . . . to 415a is (01), the logical value one is input to the first input terminal of each gate circuit 40e, 41e . . . to 415e The logical value zero is input to the second input terminal of each of the gate circuits 40e, 41e . . . to 415e. Therefore, when the pulse input to the third input terminal of each gate circuit 40e, 41e . . . to 415e is "H (high)", the first output terminal of each of the gate circuits 40e, 41e . . . to 415eoutputs "L (logical value zero)" to the gate of each P channel field effect transistor 40f, 41f . . . to 415f.

At this time, the second output terminal of each of the gate circuits 40e, 41e . . . to 415e outputs "L (logical value zero)" to the gate of each N channel field effect transistor 40g, 41g . . . to 415g. In contrast, when the pulse input to the third input terminal of each gate circuit 40e, 41e . . . to 415e is "L (low)", the first output terminal of each of the gate circuits 40e, 41e . . . to 415e outputs "H (logical value 1)" to the gate of each P channel field effect transistor 40f, 41f . . . to 415f. At this time, the second output terminal of each gate circuit 40e, 41e . . . to 415e outputs "H (logical value 1)" to the gate of the N channel field effect transistors 40g, 41g . . . to 415g. As a result, each of the processing circuits 40b, 41b . . . to 415b directly outputs the input pulse input to the third input terminal as shown in FIG. 7(3).

When the data stored in each of the memory elements 40a, 41a . . . to 415a is (10), the logical value zero is input to the first input terminal of each of the gate circuits 40e, 41e . . . to 415e and the logical value one is input to the second input terminal of each of the gate circuits 40e, 41e . . . to 415e. Therefore, when the pulse input to the third input terminal of each of the gate circuits 40e, 41e . . . to 415e is "H (high)", the first output terminal of each of the gate circuits 40e, 41e . . . to 415e outputs "H (logical value 1)" to the gate of each P channel field effect transistor 40f, 41f . . . to 415f. At this time, the second output terminal of each of the gate circuits 40e, 41e . . . to 415e outputs "H (logical value 1)" to the gate of each of the N channel field effect transistors 40g, 41g . . . to 415g.

Alternatively, when the pulse input to the third input terminal of each of the gate circuits 40e, 41e . . . to 415e is "L (low)", the first output terminal of each of the gate circuits 40e, 41e . . . to 415e outputs "L (logical value zero)" to the gate of each of the P channel field effect transistors 40f, 41f . . . to 415f. At this time, the second output terminal of each of the gate circuits 40e, 41e . . . to 415e outputs "L (logical value zero)" to the gate of each N channel field effect transistor 40g, 41g . . . to 415g. As a result, each of the processing circuits 40b, 41b . . . to 415b outputs the pulse input to the third input terminal after reversing the pulse as shown in FIG. 7(4). The data (11) will not be stored in each of the memory elements 40a, 41a . . . to 415a.

Figure 8:
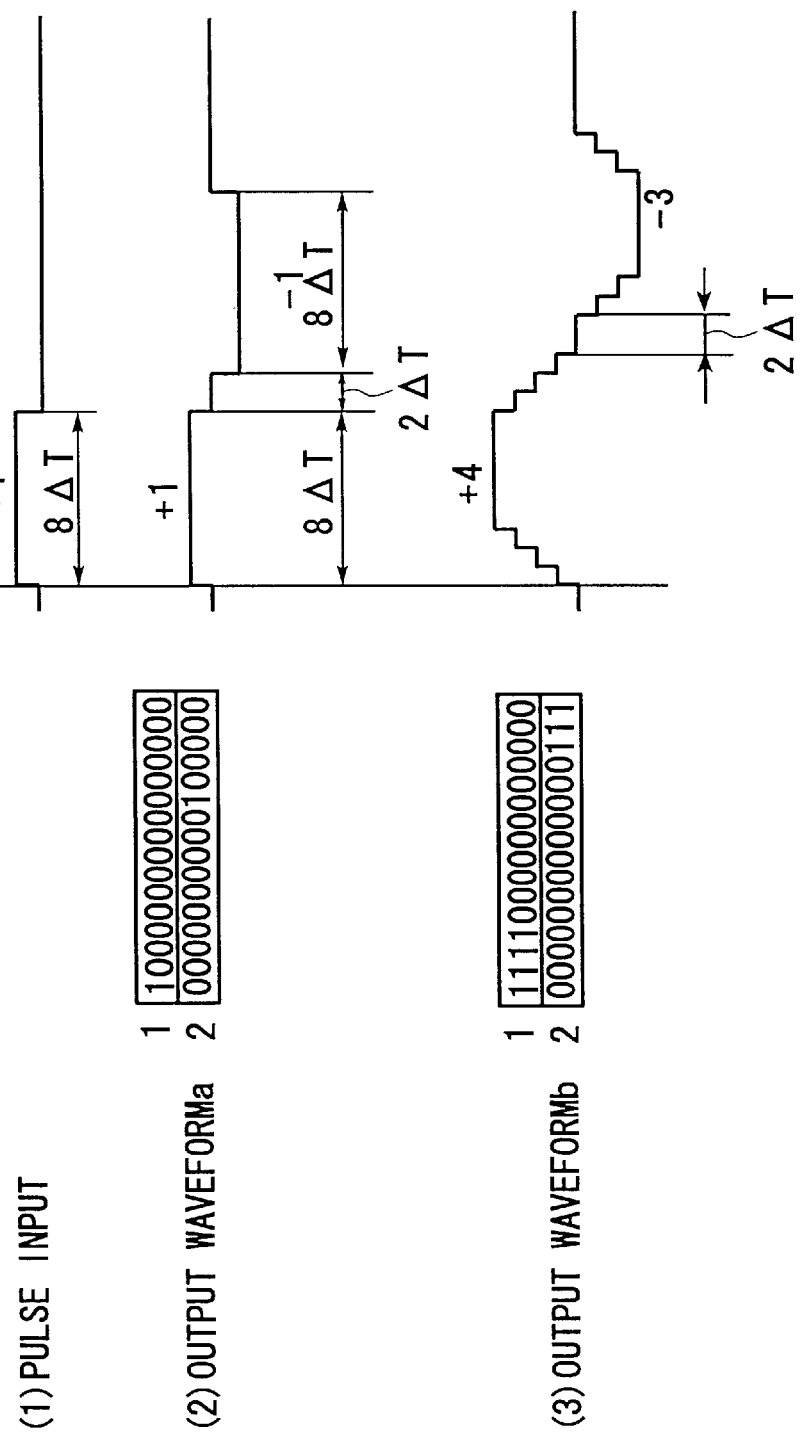
FIG. 8 shows examples of waveforms generated by the waveform generation circuit of a second embodiment of the waveform generator according to the present invention.

FIG. 8 shows examples of the waveform generated by the arbitrary waveform generator of the second embodiment according to the present invention. The pulse width T of the input pulse is 8 times as long as the delay duration ΔT of each of the delay elements 30, 31 . . . to 314 of the waveform generation circuit 16 in this embodiment as shown in FIG. 8 (1).

When the first bits of the data stored in the memory elements 40a, 41a . . . to 415a are "1000000000000000" and the second bits are "0000000000100000, the output waveform "a" will be separated into positive and negative pulses with 2ΔT intervals as shown in FIG. 8 (2).

When the first bits of the data stored in the memory elements 40a, 41a . . . to 415a are "1111000000000000" and the second bits thereof are "00000000000000111, the output waveform "b" will be a positive trapezoidal waveform. This will consist of four positive pulses overlapped with each being shifted ΔT, Δ2T intervals, and a negative trapezoidal waveform consisting of three negative pulses overlapped with each shifted ΔT as shown in FIG. 8 (3).

As described above, the waveform generator of the second embodiment according to the present invention can generate an arbitrary waveform having positive and negative values. The waveform also has a time resolution ΔT which is a delay duration of each of the delay elements 30, 31 . . . to 314 produced by changing the data stored in each of the memory elements 40a, 41a . . . to 415a.

Third Embodiment

Figure 9:
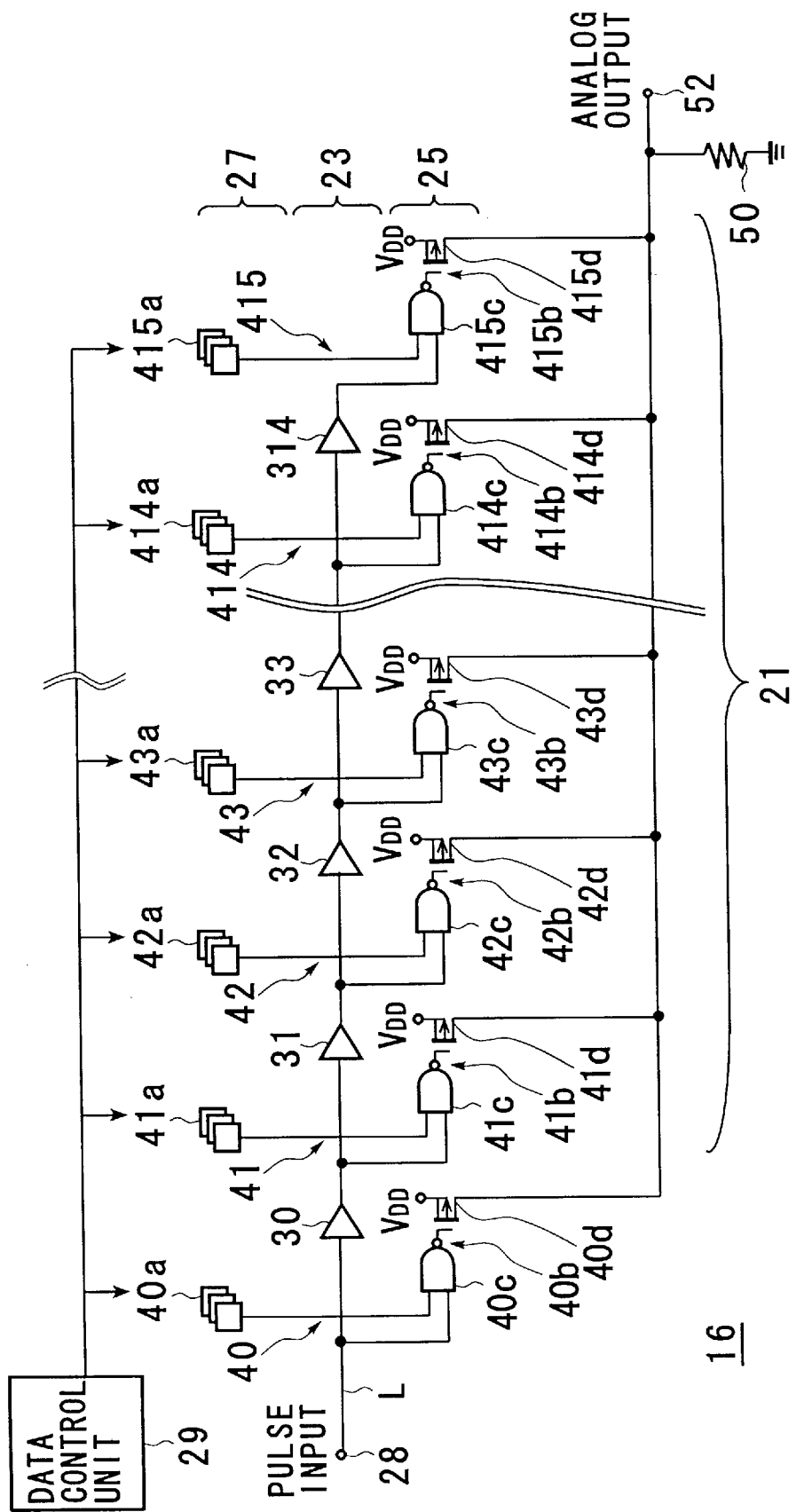
FIG. 9 is a circuit diagram of a waveform generation circuit of a third embodiment of the arbitrary waveform generator according to the present invention.
Figure 11:
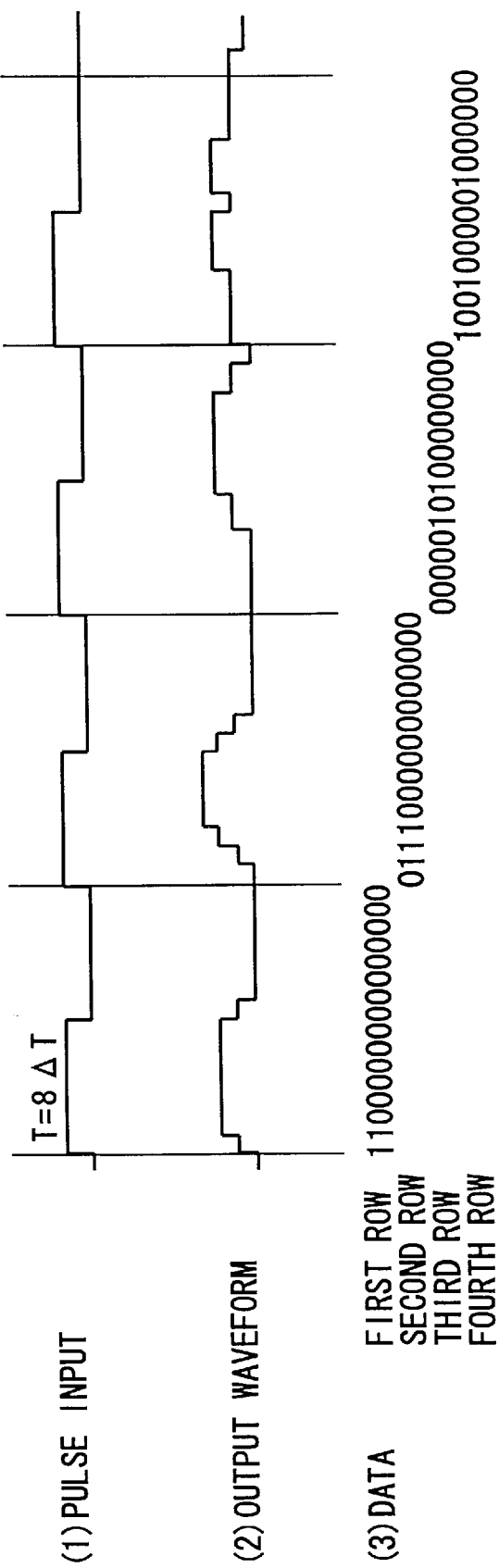
FIG. 11 shows examples of waveforms generated by the waveform generation circuit of a third embodiment of the waveform generator according to the present invention.

The third embodiment of the arbitrary waveform generator according to the present invention will be explained with reference to FIGS. 9 to 11. FIG. 9 shows a circuit diagram of the third embodiment of the arbitrary waveform generator. The elements or parts of the waveform generator of the third embodiment which are same as or similar to those of the waveform generator of the first embodiment shown in FIGS. 3 and 4 have same numerals as those shown in FIGS. 3 and 4. The explanation of those elements or parts will therefore be simplified or omitted.

The difference between the waveform generation circuit 16 of the third embodiment and that of the first embodiment is that each of the circuit elements 40, 41 . . . to 415 comprises memory elements 40a, 41a . . . to 415a each having a plurality of data rows. This means that each of the memory elements 40a, 41a . . . to 415a stores a large volume of data for generating the waveform. The waveform generation circuit 16 further comprises a data control unit 29 for controlling the memory elements 40a, 41a . . . to 415a . This allows the data from one of the data rows to be output at predetermined intervals. Each of the processing circuits 40b, 41b . . . to 415b outputs the signal based on the data for generating the waveform stored in the memory elements 40a, 41a, 42a . . . to 415a. It is done in such a way to ensure the cycle of the output signal is longer than that of the input signal. This means that each of the processing circuits 40b, 41b . . . to 415b outputs the signal based on the data for generating the waveform controlled by the data control unit 29.

In this embodiment, the waveform generation circuit 16 can generate a waveform having a long cycle. This is done by sequentially choosing one of the data row from among the many stored in each of the memory elements 40a, 41a, 42a . . . to 415a. For example, when the memory elements 40a, 41a . . . to 415a are composed of 4 data rows, the data control unit 29 sequentially choose one of the rows to be output to give an output waveform with a longer cycle than that of the input pulse.

Actual examples of the output waveform of the arbitrary waveform generator of this embodiment will be explained with reference to FIGS. 10 and 11. FIG. 10 shows one example of the 4 data rows stored in the memory elements and FIG. 11 shows the output waveform generated by the data shown in FIG. 10. In this actual example, the pulse width T of the input pulse is 8 times as long as the delay duration ΔT of each of the delay elements 30, 31 . . . to 314 of the waveform generation circuit 16. The pulse is input every 16ΔT duration.

Furthermore, in this actual example the waveform is generated by the data from the 4 data rows shown in FIG. 10. The data of the first row is "1100000000000000", the second row "0111000000000000", the third row "0000010100000000", and the fourth row "1001000001000000".

The data of one of the data rows is sequentially output at the same time as the input pulse. As shown in FIG. 11, the data of the first row is output with the first input pulse, the second row output with the second input pulse, the third row output with the third input pulse, and the fourth row output with the fourth input pulse. By using the data of the 4 data rows, the waveform of the first 16ΔT duration is based on the waveform data of the first row, the waveform of the next 16ΔT duration based on the waveform data of the second row and so on until the fourth row as shown in FIG. 11 (3).

As described above, the waveform generator of the third embodiment according to the present invention can generate an arbitrary waveform having a long cycle. This is done by sequentially choosing the data stored in each of the memory elements 40a, 41a . . . to 415a.

Fourth Embodiment

Figure 12:
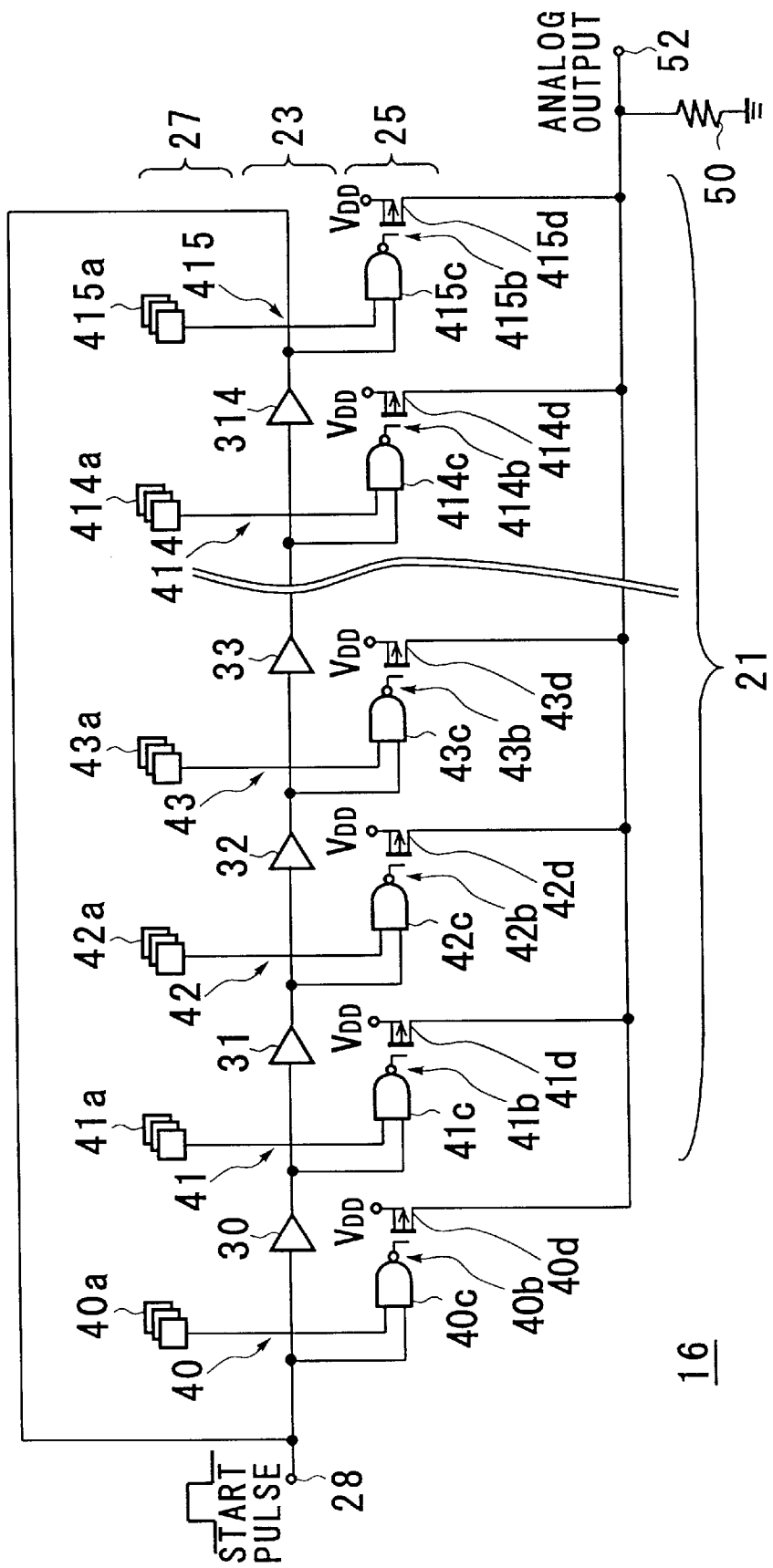
FIG. 12 is a circuit diagram of a waveform generation circuit of a fourth embodiment of the arbitrary waveform generator according to the present invention.

The fourth embodiment of the arbitrary waveform generator according to the present invention will be explained with reference to FIG. 12. FIG. 12 shows a circuit diagram of the fourth embodiment of the arbitrary waveform generator. The elements or parts of the waveform generator of the fourth embodiment which are same as or similar to those of the waveform generator of the first embodiment shown in FIGS. 3 and 4 have same numerals as those shown in FIGS. 3 and 4. The explanation of those elements or parts will therefore be simplified or omitted.

The waveform generation circuit 16 of the fourth embodiment comprises fifteen delay elements 30, 31 ... to 314 each having an input terminal and an output terminal and cascaded with each other. The input terminal of the first delay element 30 is connected to the input terminal 28 of the waveform generation circuit 16. The output terminal of the last delay element 314 is connected to the input terminal of the first delay element. This means that the fifteen delay elements 30, 31 ... to 314 are circularly connected with each other.

Once a start pulse is fed to the input terminal 28, the pulse delayed by each of the delay elements 30, 31 ... to 314 is output from the terminal of the last delay element 314. This pulse is then input to the input terminal of the first delay element 30. Therefore, the waveform generator of the fourth embodiment according to the present invention can successively generate waveforms having predetermined cycle. The generation of a predetermined long cycle is achieved by sequentially choosing the data stored in each of the memory elements 40a, 41a, to 415a.

As described above, the waveform generator of the fourth embodiment according to the present invention can successively generate an arbitrary waveform.

Fifth Embodiment

Figure 13:
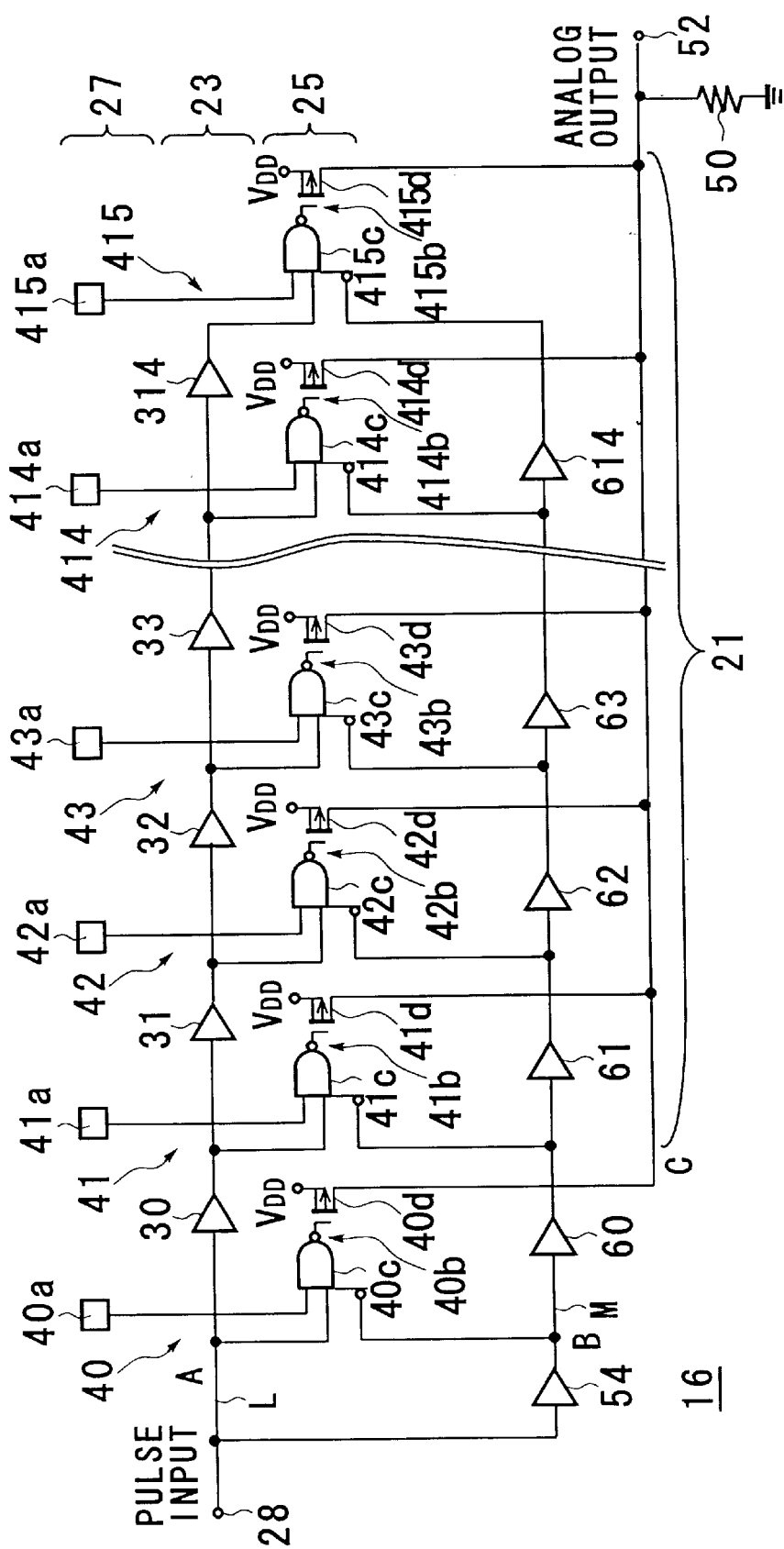
FIG. 13 is a circuit diagram of a waveform generation circuit of a fifth embodiment of the arbitrary waveform generator according to the present invention.

The fifth embodiment of the arbitrary waveform generator according to the present invention will be explained with reference to FIGS. 13 to 15. FIG. 13 shows a circuit diagram of the fifth embodiment of the arbitrary waveform generator. The elements or parts of the waveform generator of the fifth embodiment which are same as or similar to those of the waveform generator of the first embodiment shown in FIGS. 3 and 4 have same numerals as those shown in FIGS. 3 and 4. The explanation of those elements or parts will therefore be simplified or omitted.

The waveform generation circuit 16 of the fifth embodiment comprises the first fifteen cascaded delay elements 30, 31 ... to 314 cascaded with each other, and second fifteen cascaded delay elements 60, 61 ... to 614. The first and the second cascaded delay elements are connected in parallel relationship with each other. The delay duration of each of the second cascaded delay elements 60, 61 ... 614 is the same as that of each of the first cascaded delay elements 30, 31 ... 314. There is also provided a delay element 54 having a delay duration $\Delta\tau$ between the input terminal 28 and the first delay element 60 of the second cascaded delay elements 60, 61 ... to 614. The delay duration $\Delta\tau$ of the delay element 54 decides the pulse width $\Delta\tau$ of the output pulse.

In addition to each of the memory elements 46a, 41a ... to 415a and the input signal line L, a signal line!M is provided to connect the second cascaded delay elements 60, 61 ... to 614. The signal line M is connected to the input terminals of each of the NAND gates 40c, 41c, 42c ... to 415c. The data from the signal line M is reversed before it is input to each of the NAND gates 40c, 41c ... to 415c.

Figure 14:
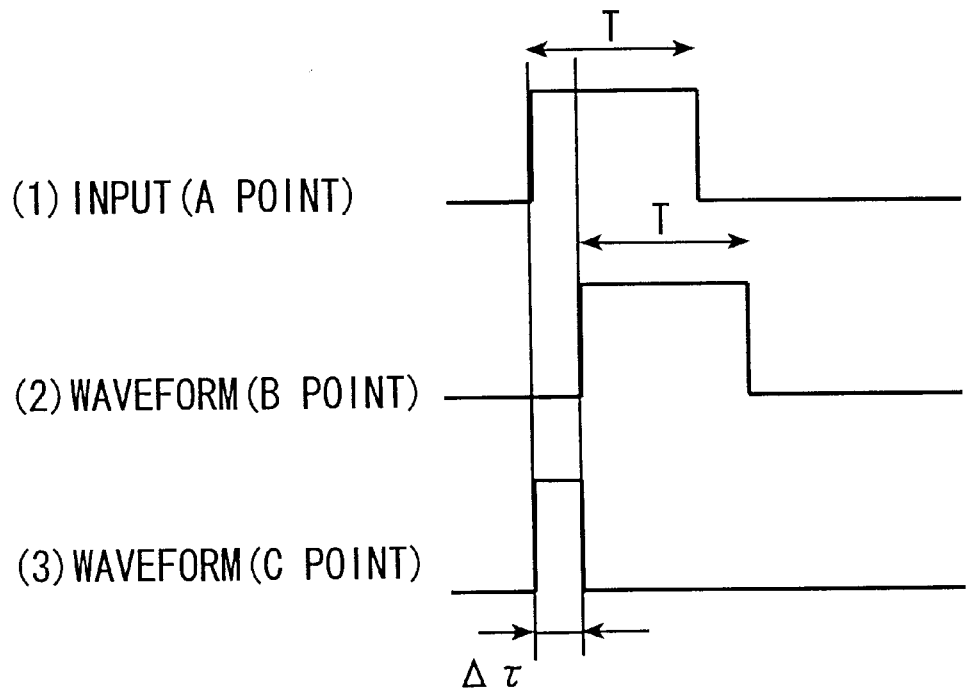
FIG. 14 shows examples of waveforms generated by the waveform generation circuit of a fifth embodiment of the waveform generator according to the present invention.

When the data stored in each of the memory elements 40a, 41a ... to 415a is "1" and the pulse having a pulse width T is input to the terminal 28, the waveform of the point A is as shown in FIG. 14 (1). The waveform of the point B is as shown in FIG. 14 (2), as the propagation of the input pulse is delayed by the delay element 54 for delay duration $\Delta\tau$. The waveform of the point B is reversed for input to each of the NAND gates 40c, 41c ... to 415c. Therefore, the waveform of the point C becomes a short pulse having a pulse width $\Delta\tau$ as shown in FIG. 14 (3). This means that each of the processing circuits 40b, 41b, ... to 415b outputs signal on the basis of the input signal (pulse), the data for generating the waveform stored in each of the memory elements 40a, 41a ... to 415a, and the delayed input data whose propagation is delayed at a predetermined delay duration. In this actual embodiment, the input signal is delayed for the delay duration $\Delta\tau$ to be input to each of the processing circuits 40b, 41b, ... to 415b. The composing unit 21 outputs a pulse as a waveform, with a predetermined pulse width based on the output signals. The waveform generation circuit 16 can generate a short pulse with a predetermined pulse width $\Delta\tau$ regardless of the pulse width of the input pulse.

The output waveform generated by the arbitrary waveform generator of the fifth embodiment will be explained with reference to FIG. 15.

Figure 15:
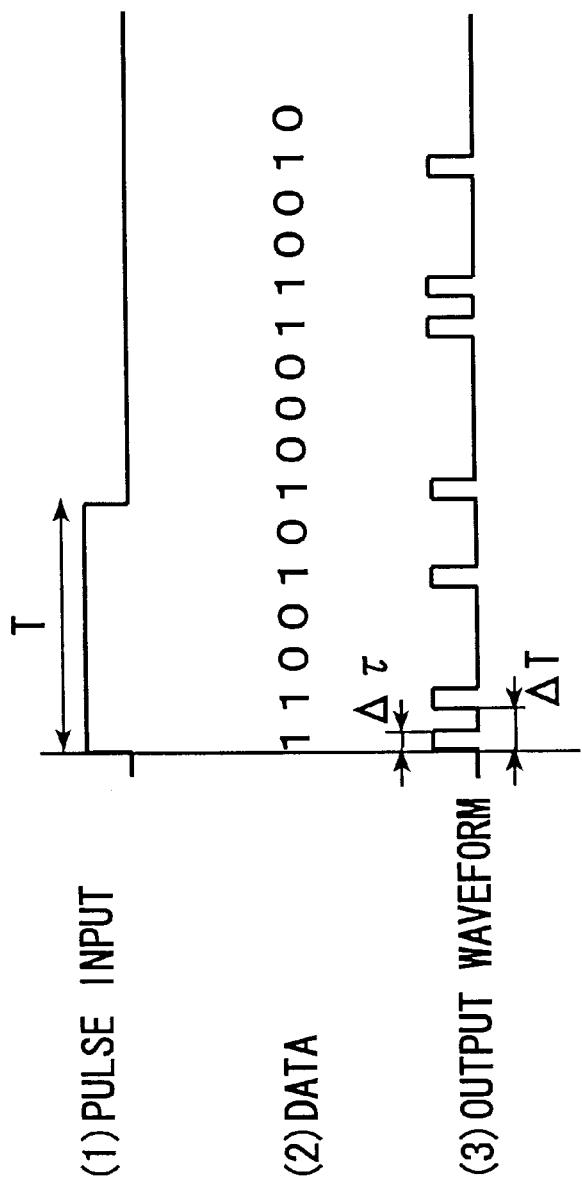
FIG. 15 shows examples of waveforms generated by the waveform generation circuit of a fifth embodiment of the waveform generator according to the present invention.

When a pulse having a pulse width T as shown in FIG. 15 (1) is input, and the data for generating the waveform stored in the memory elements 40a, 41a, ... to 415a is "1100101000110010" as shown in FIG. 15 (2), short pulses each having a pulse width $\Delta\tau$ in accordance with the data for generating the waveform are output. When both of the memory elements which are adjacent to each other store "1", the time duration between the starting points of the first and second pulses becomes $\Delta T$ as shown in FIG. 15 (3).

As described above, the waveform generator of the fifth embodiment according to the present invention can generate an arbitrary waveform having predetermined short pulses at an arbitrary interval. Furthermore, the pulse width $\Delta T$ of the short pulses can be as short as 10 psec order.

The waveform generator of the fifth embodiment can generate a waveform which is suitable for pulse modulation. The pulse modulation includes a pulse amplitude modulation, a pulse position modulation, a pulse width modulation, a pulse number modulation, a pulse code modulation, and similar variations. The waveform generator of the fifth embodiment is suitable for the pulse number modulation in which the diffusion value of the modulation signal is expressed by the pulse number.

Sixth Embodiment

Figure 16:
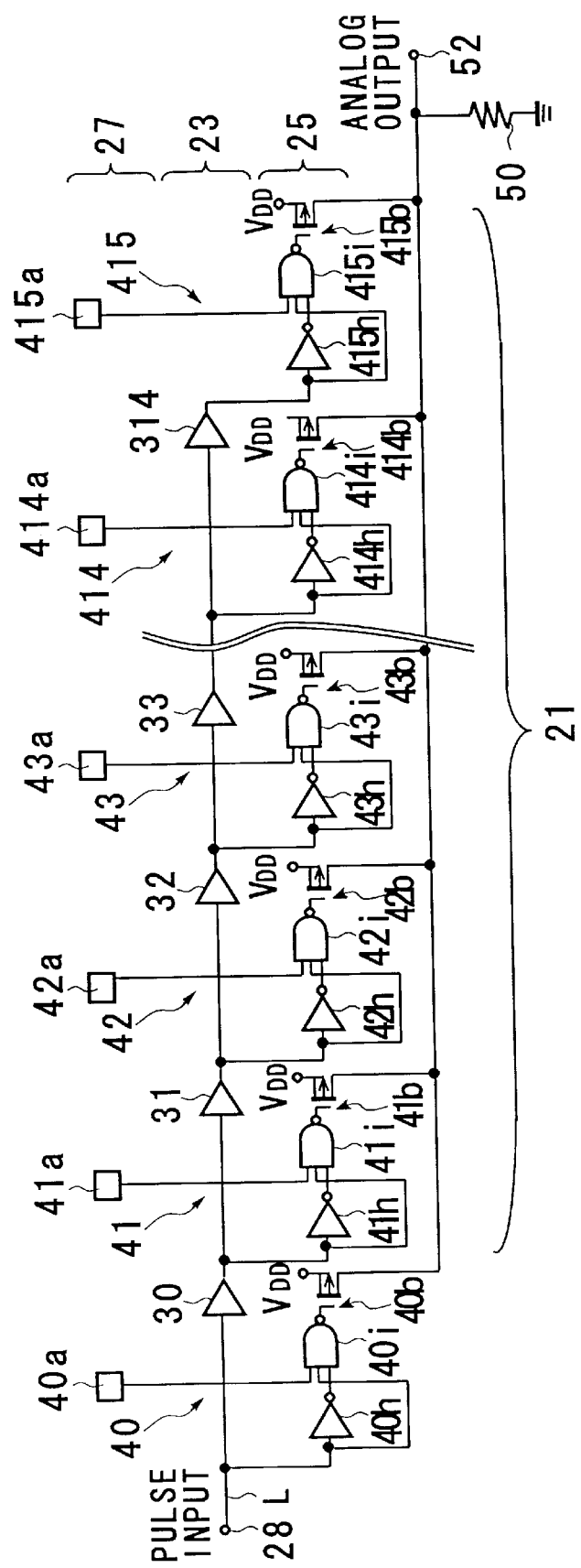
FIG. 16 is a circuit diagram of a waveform generation circuit of a sixth embodiment of the arbitrary waveform generator according to the present invention.

The sixth embodiment of the arbitrary waveform generator according to the present invention will be explained with reference to FIG. 16. FIG. 16 shows a circuit diagram of the sixth embodiment of the arbitrary waveform generator. The elements or parts of the waveform generator of the sixth embodiment which are same as or similar to those of the waveform generator of the first embodiment shown in FIGS. 3 and 4 have same numerals as those shown in FIGS. 3 and 4. The explanation of those elements or parts will therefore be simplified or omitted.

The waveform generator of the sixth embodiment according to the present invention generates an arbitrary waveform having predetermined short pulses the same as the waveform generator of the fifth embodiment. In this embodiment, inverters 40h, 41h ... to 415h and NAND gates 40h, 41h, 42h, 43h, ... to 415h are utilized to generate a waveform having short pulses.

The first input terminal of each of the NAND gates 40i, 41i ... to 415i is connected to the respective memory elements 40a, 41a ... to 415a. The second input terminal of each of the NAND gates 40i, 41i ... to 415i is connected to the respective input terminal of each of the inverters 40h, 41h ... to 415h. The third input terminal of each of the NAND gates 40i, 41i ... to 415i is connected to the respective output terminal of each of the inverters 40h, ... to 415h. The input terminal of each of the inverters 40h, 41h ... to 415h is connected to the input signal line L.

When the data stored in each of the memory elements 40a, 41a ... to 415a is "1" and the pulse is input to the terminal 28, a waveform having a short pulse is generated. The pulse width of the waveform generated is same as the delay duration of each of the inverters 40h, 41h ... to 415h. This means that each of the processing circuits 40b, 41b ... to 415b outputs signal on the basis of the input signal (pulse), the data for generating the waveform stored in each of" the memory elements 40a, 41a ... to 415a, and the delayed input data whose propagation is delayed at a predetermined delay duration. In this actual embodiment, the input signal is delayed for the delay duration of each of the inverters 40h, 41h ... to 415h and input to each of the processing circuits 40b, 41b ... to 415b. The composing unit 21 outputs a pulse as an output waveform having a predetermined pulse width based on the output signals. The waveform generation circuit 16 can generate a short pulse having a predetermined pulse width which is as long as the delay duration of each of the inverters 40h, 41h ... to 415h regardless of the pulse width of the input pulse.

As described above, the waveform generator of the sixth embodiment according to the present invention can generate an arbitrary waveform having predetermined short pulses of an arbitrary interval.

Seventh Embodiment

Figure 17:
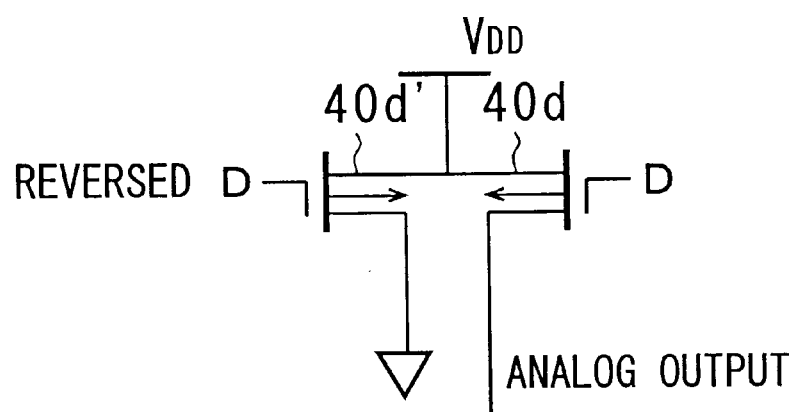
FIG. 17 is a circuit diagram of a current supply circuit of a waveform generation circuit of a seventh embodiment of the arbitrary waveform generator according to the present invention.

The seventh embodiment of the arbitrary waveform generator according to the present invention will be explained with reference to FIG. 17. FIG. 17 shows a circuit diagram of a current supply circuit of the seventh embodiment of the arbitrary waveform generator.

In the current supply circuit of the waveform generation circuit of this embodiment, a pair of P channel field effect transistors 40d and 40d' are utilized. The sources of the P channel field effect transistors 40d and 40d are held in communication with each other and both are connected to the power source voltage VDD. The drain of the P channel field effect transistor 40d is connected to the output terminal 52 and the drain of the P channel field effect transistor 40d' is connected to ground.

The output signal D from the NAND gate 40c is applied to the gate of the P channel field effect transistors 40d. The reversed signal of the output signal D is applied to the gate of the P channel field effect transistors 40d'.

By constructing the current supply circuit as described above, current changes can be minimized even when the output signal D varies. This prevents the distortion and delay of analog waveforms and makes it possible to actualize a high-speed current switch.

Eighth Embodiment

The eighth embodiment of the arbitrary waveform generator according to the present invention will be explained with reference to FIGS. 18 to 21.

Figure 18:
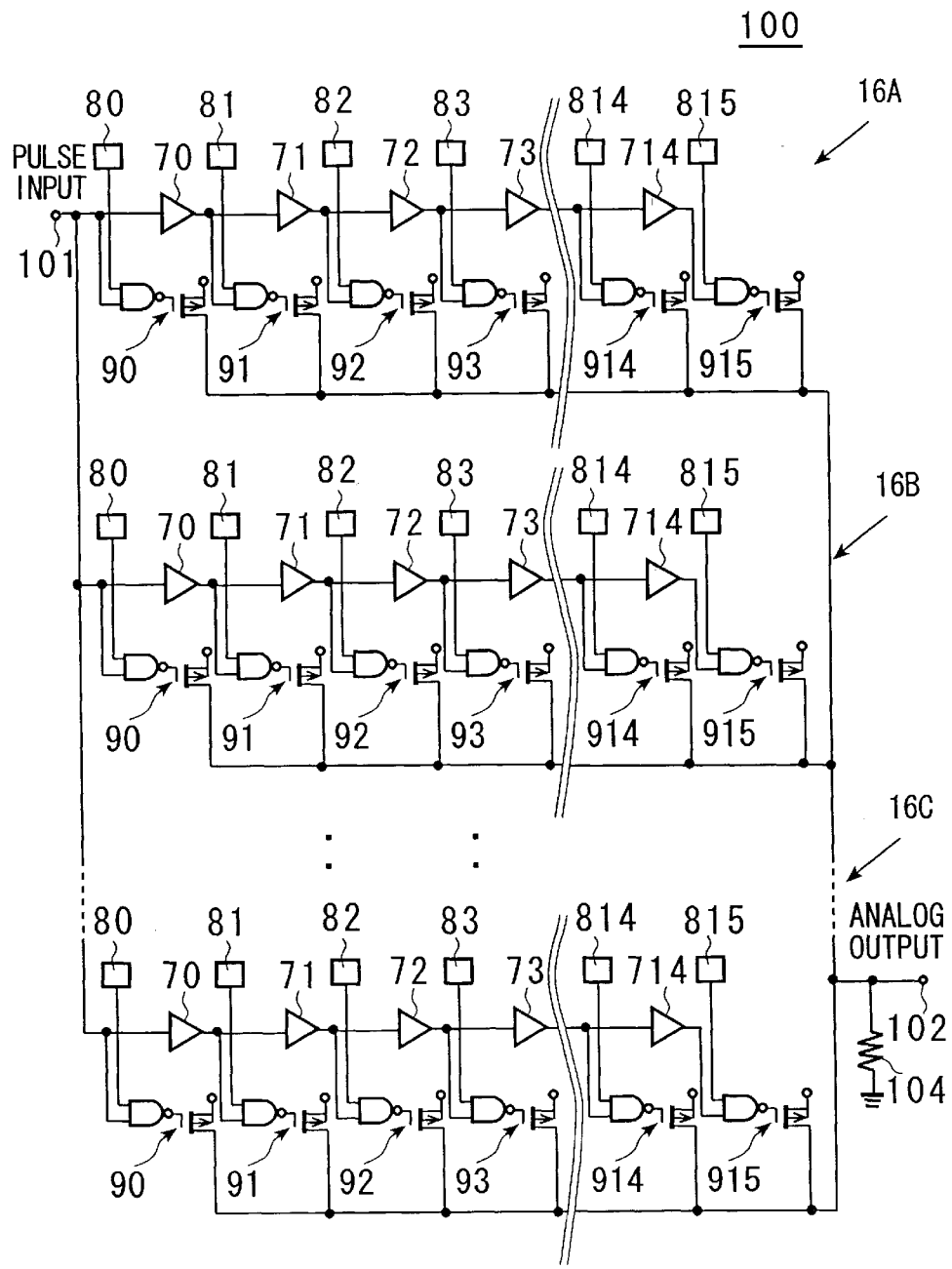
FIG. 18 is a circuit diagram of a waveform generation circuit of an eighth embodiment of the arbitrary waveform generator according to the present invention.

FIG. 18 shows an actual example of the eighth embodiment of the waveform generation circuit of the arbitrary waveform generator. The waveform generation circuit 100 of this embodiment comprises an input terminal 101, an output terminal 102, and a plurality of waveform generation circuits 16A to 16C. Each of these are the equivalent of the waveform generation circuit 16 shown in FIG. 4. The plurality of waveform generation circuits 16A to 16C are connected in parallel relationship with each other and respectively connected to the input terminal 101 and the output terminal 102. Each of the waveform generation circuits 16A to 16C comprises a delay unit and a processing unit corresponding to the delay unit.

The delay units of each of the waveform generation circuits 16A to 16C are also connected in parallel relationship with each and comprise fifteen delay elements 70, 71 ... to 714 which are cascaded with each other. Each of the waveform generation circuits 16A to 16C comprises sixteen memory elements 80, 81 ... to 815 and processing circuits 90, 91 ... to 915. The processing circuits 90, 91 ... to 915 are provided between the input terminal 101 and the first delay element 70, between two adjacent delay elements 70, 71 ... to 714, and between the last delay element 714 and the output terminal 102. Each of the memory elements 80, 81 ... to 815 are connected to each of the respective processing circuits 90, 91 ... to 915. Each of the processing circuits 90, 91 ... to 915 comprises a NAND gate and a P channel field effect transistor.

The waveform generation circuit 100 is comprised of the of waveform generation circuits 16A to 16C which are all identical. The first delay element 70 of each of the waveform generation circuits 16A to 16C are held in communication with each other to be connected to the input terminal 101. A predetermined pulse is then input from the clock control unit 26. The drain of the P channel field effect transistor of each of the processing circuits 90, 91 ... to 915 of the waveform generation circuits 16A to 16C are held in communication with each other to be connected to the output terminal 102. From this, the analog signal is output. The output terminal is connected to the ground via a resistance 104.

The waveform generation circuit of this embodiment can generate a waveform whose shape along the time axis is determined by the data stored in each of the memory elements 80, 81 ... to 815 of each of the waveform generation circuits 16A to 16C. The amplitude value of this waveform is determined by the number of memory elements 80, 81 ... to 815 storing the data "1".

Figure 19:
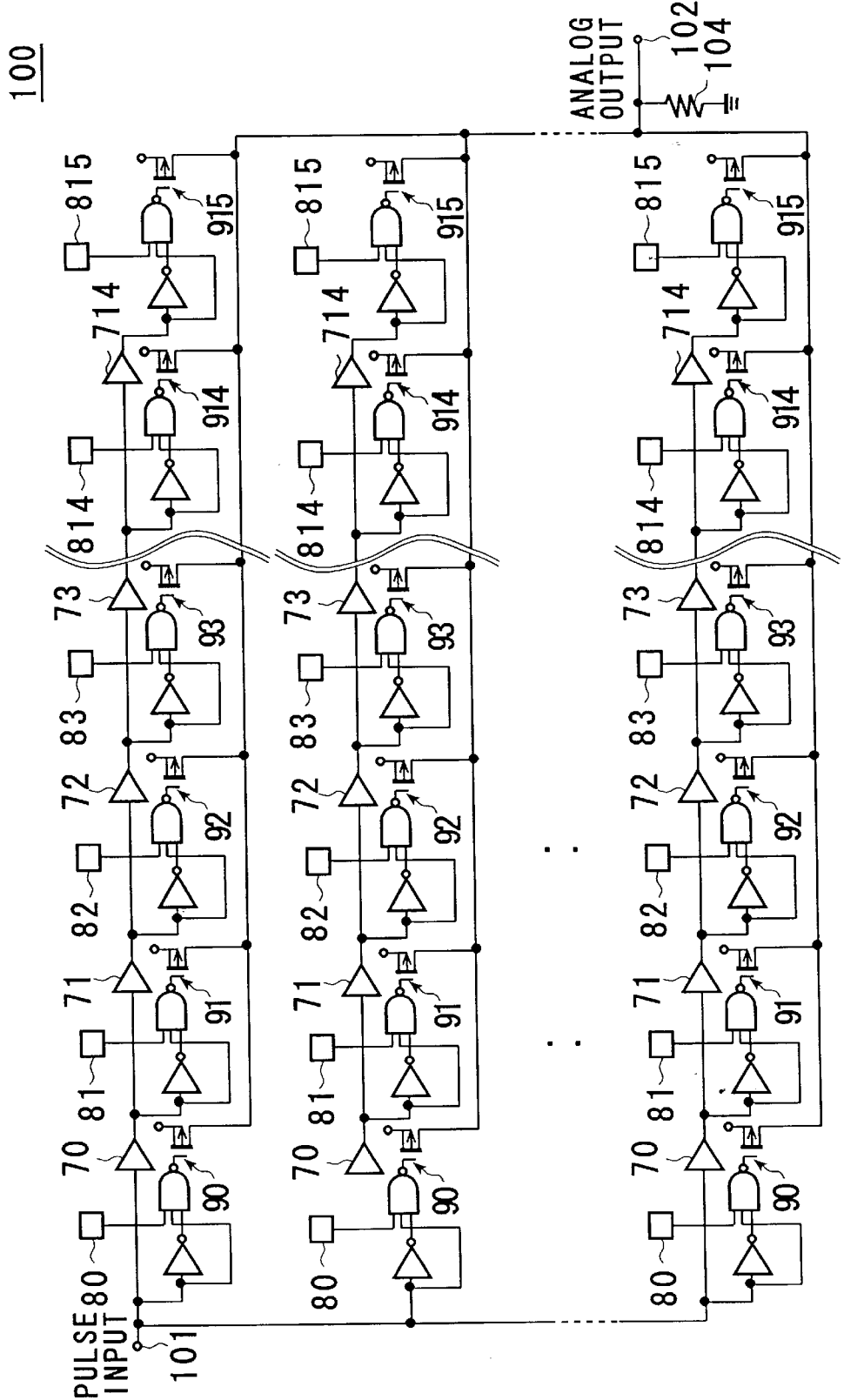
FIG. 19 is a circuit diagram of another waveform generation circuit of an eighth embodiment of the arbitrary waveform generator according to the present invention.

FIG. 19 shows second actual example of the eighth embodiment of the waveform generation circuit of the arbitrary waveform generator. The waveform generation circuit 100 of this embodiment comprises an input terminal 101, an output terminal 102, and the waveform generation circuits 16A to 16C, each of which is equivalent of the waveform generation circuit 16 shown in FIG. 16.

Each of the processing circuits 90, 91 ... to 915 is comprised of an inverter and a NAND gate. The first input terminal of the NAND gate of each of the processing circuits 90, 91 ... to 915 is connected to the respective memory elements 80, 81 ... to 815. The second input terminal of the NAND gate of each of the processing circuits 90, 91 ... to 915 is connected to the respective input terminal of each of the inverters. The third input terminal of the NAND gate of each of the processing circuits 90, 91 ... to 915 is connected to the respective output terminal of each of the inverters. The input terminal of each of the inverters is connected to the input signal line. When the input signal line sends a pulse, each of the processing circuits 90, 91 ... to 915 outputs a short pulse with a short pulse width as explained in the sixth embodiment—see FIG. 16.

Actual examples of the outputs of the waveform generation circuit 100 shown in FIG. 19 will be explained with reference to FIG. 20. In this embodiment, the waveform generation circuit 100 comprises 5 waveform generation circuits 16A to 16C each having sixteen memory elements 80, 81 ... to 815. Therefore, the data stored in the memory elements 80, 81 ... to 815 of the waveform generation circuit 100 is expressed in 5 rows and 16 columns as shown in FIG. 20 (1)

Figure 20:
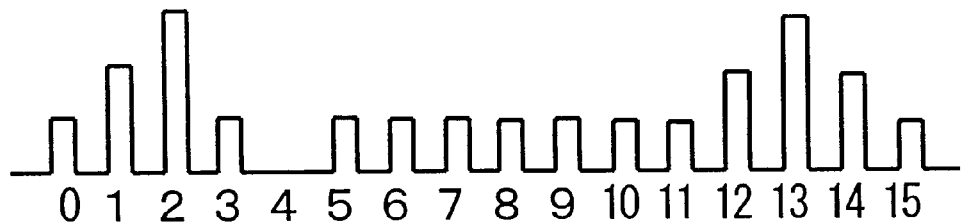
FIG. 20 shows examples of waveforms generated by the waveform generation circuit of an eighth embodiment of the waveform generator according to the present invention.

The data of the waveform generation circuit 100 of this embodiment shown in FIG. 20 (1) express the shape of the waveform along the time axis and the amplitude of each of the short pulses. FIG. 20 (2) shows a waveform generated by the data shown in FIG. 20 (1). The arbitrary waveform is corresponding to the data stored in each of the memory elements 80, 81 . . . to 815 of the waveform generation circuit 100.

The data stored in the memory elements 80 of each of the waveform generation circuits 16A to 16C (i.e. the column number zero in FIG. 20 (1)) is "00001". This contains the number one "1", therefore, a short pulse having an amplitude "1" is generated. The data stored in the memory elements 81 of each of the waveform generation circuits 16A to 16C (i.e the column number 1 in FIG. 20 (1)) is "00011". This contains the number one "1" twice, therefore, a short pulse having an amplitude "2" is generated. The data stored in the memory elements 82 of each of the waveform generation circuits (i.e. the column number 2 in FIG. 20 (1)) is "00111".

This contains the number one "1" three times, therefore, a short pulse having an amplitude "3" is generated. The data stored in the memory elements 83 of each of the waveform generation circuits 16A to 16C, the column number 3 in FIG. (1), are "00001" which contains one "1", therefore, a short pulse having an amplitude "1" is generated. The data stored in the memory elements 84 of each of the waveform generation circuits 16A to 16C, the column number 4 in FIG. (1), are "00000" which contains no "1", therefore, no short pulse is generated. The data stored in the memory elements 85 to 89 of each of the waveform generation circuits 16A to 16C, the column number 5 to 9 in FIG. 20 (1), are "00001" which contains one "1", therefore, short pulses each having an amplitude "1" are generated.

The data stored in the memory elements 810 of each of the waveform generation circuits 16A to 16C, the column number 10 in FIG. 20 (1), are "00000" which contains no "1", therefore, no short pulse is generated. The data stored in the memory elements 811 of each of the waveform generation circuits 16A to 16C, the column number 11 in FIG. 20 (1), are "00001" which contains one "1", therefore, a short pulse having an amplitude "1" is generated. The data stored in the memory elements 812 of each of the waveform generation circuits 16A to 16C, the column number 12 in FIG. 20 (1), are "00011" which contains two "1", therefore, a short pulse having an amplitude "2" is generated.

The data stored in the memory elements 813 of each of the waveform generation circuits 16A to 16C, the column number 13 in FIG. 20 (1), are "00111" which contains three "1", therefore, a short pulse having an amplitude "3" is generated. The data stored in the memory elements .814 of each of the waveform generation circuits 16A to 16C, the column number 14 in FIG. 20 (1), are "00011" which contains two "1", therefore, a short pulse having an amplitude "2" is generated. The data stored in the memory elements 815 of each of the waveform generation circuits 16A to 16C, the column number 15 in FIG. 20 (1), are "00001" which contains one "1", therefore, a short pulse having an amplitude "1" is generated.

The amplitude of each of the pulses is determined by the number of "1"stored in each of the memory units 80, 81 . . . to 815. The important point is how many times "1" is included in each of the columns shown in FIG. 20 rather than the rows which contain "1". Therefore, the waveform generation circuit of this embodiment can generate a waveform having an amplitude corresponding to the number of processing circuits sending the output signal.

Figure 21:
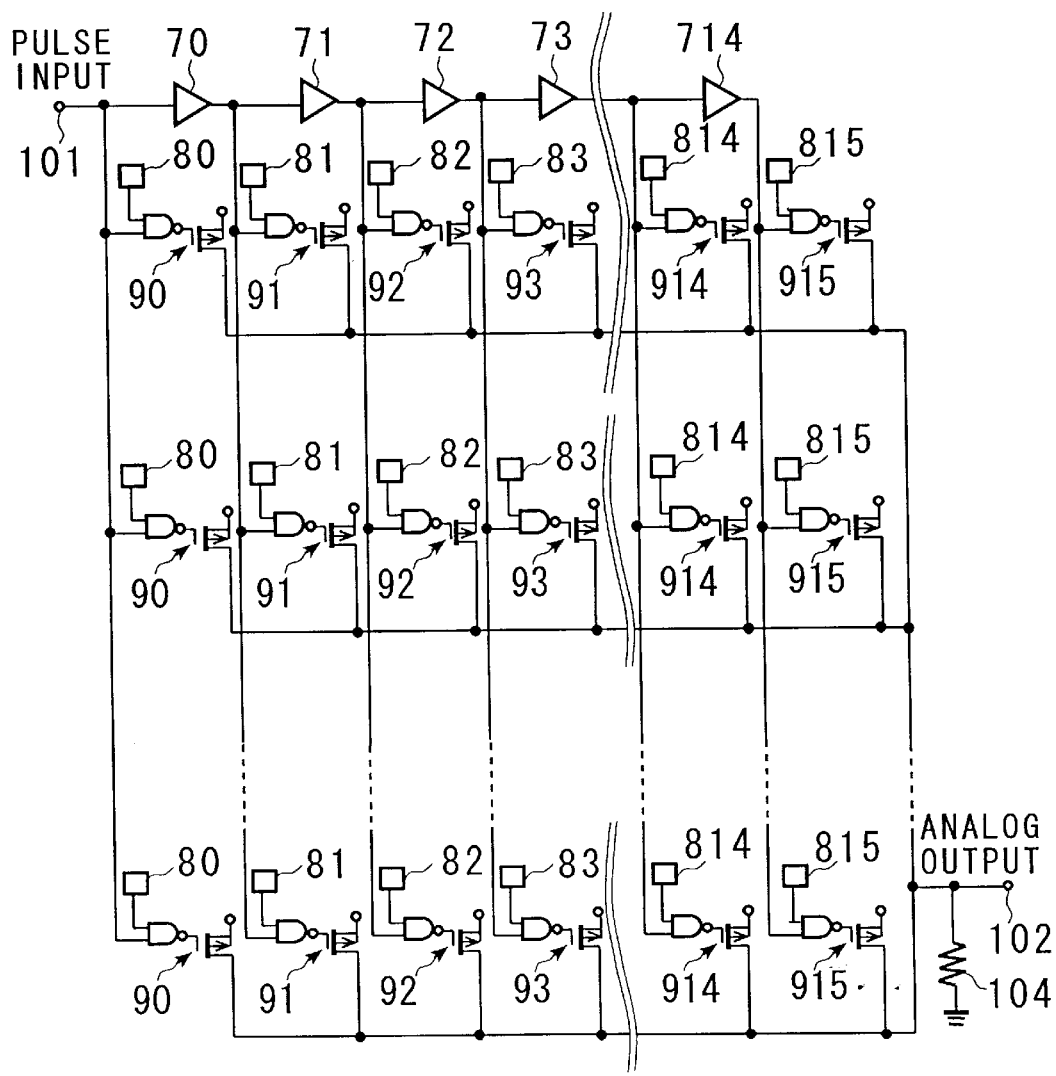
FIG. 21 is a circuit diagram of a further waveform generation circuit of an eighth embodiment of the arbitrary waveform generator according to the present invention.

FIG. 21 shows a third example of the waveform generation circuit of the eighth embodiment of the waveform generator. The waveform generation circuit 100 shown in FIG. 21 is similar to the waveform generation circuit 100 shown in FIG. 18 the difference being this one is comprised of only one set of cascaded delay elements. Each of the delay elements 70, 71 . . . to 714 is connected to the respective processing circuits 90, 91 . . . 915. This means that, for example, the delay element 70 is connected to the plurality of processing circuits 90. The usual function is to input delayed pulses into each of the processing circuits 90. It is therefore desirable for each of the delay elements 70, 71 . . . to 714 to have a large driving power.

The waveform generation circuit of this example includes one set of cascade delay elements 70, 71 . . . to 714 and a plurality of waveform generation circuits 16A to 16C. Each comprises memory units 80, 81 . . . to 815 and processing circuits 90, 91 . . . to 915.

The waveform generation circuit of this example can accurately generate a predetermined arbitrary waveform. This is due to the fact that each of the delay elements is commonly connected to the processing circuits having same numerals which eliminates the time lag of the signal output from each of the processing circuits.

Ninth Embodiment

Figure 22:
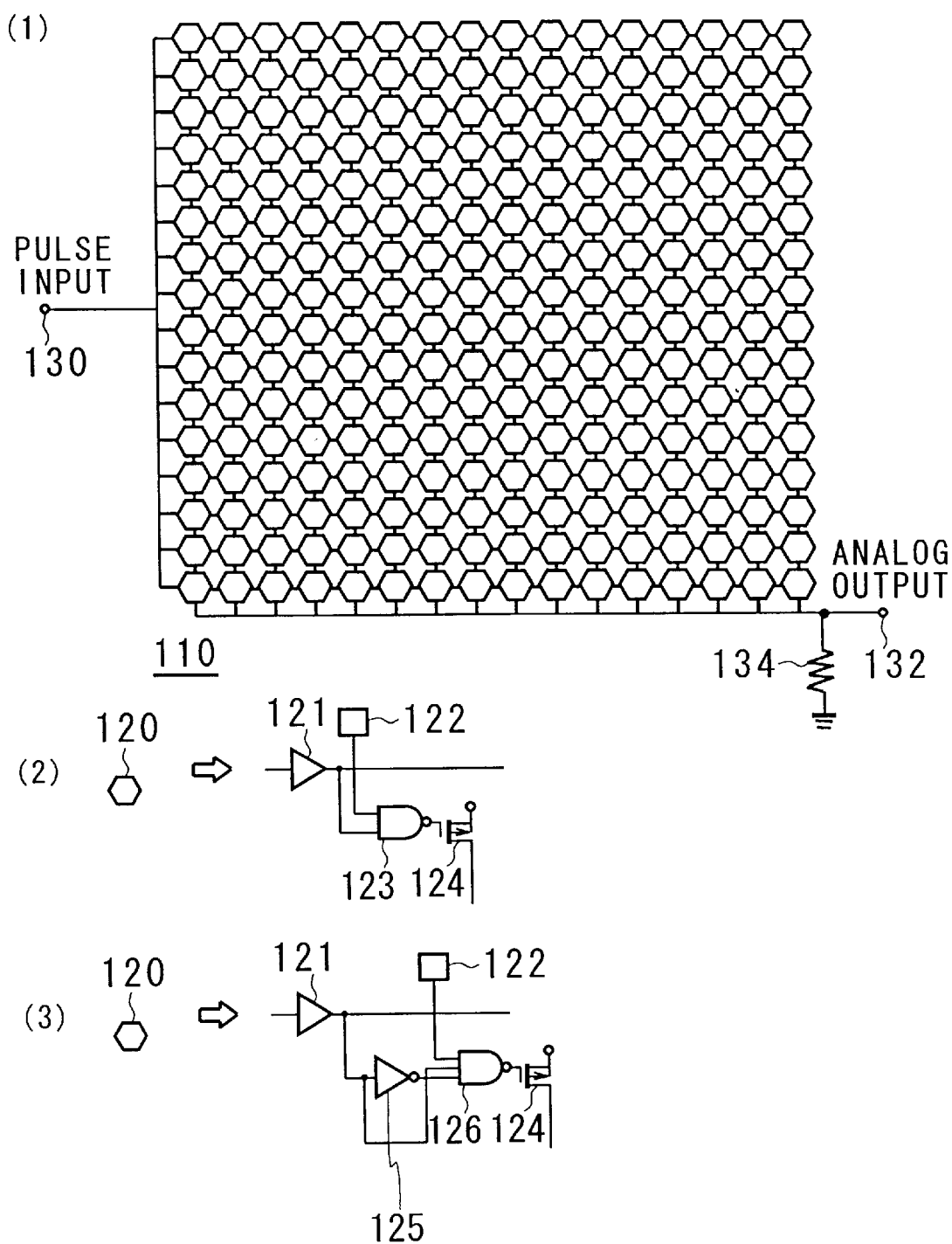
FIG. 22 is a circuit diagram of a waveform generation circuit of a ninth embodiment of the arbitrary waveform generator according to the present invention.

The ninth embodiment of the arbitrary waveform generator according to the present invention will be explained with reference to FIG. 22. FIG. 22 is a circuit diagram of the waveform generation circuit of the waveform generator of the ninth embodiment.

The waveform generation circuit 110 of this embodiment comprises numerous delay circuits arranged in a matrix form. The rows of the delay circuits 120 in the matrix form are connected with each other through the input signal line. The columns of the delay circuits 120 in the matrix form are connected with each other through the output signal line. The input signal lines are connected to the input terminal 130 and the output signal lines are connected to the output terminal 132. The output terminal 132 is connected to the ground via a resistance 134.

The delay circuit 120 shown in FIG. 22 (2) comprises a delay element 121, a memory element 122, a NAND gate 123, and a P channel field effect transistor (P channel FET) 124. The delay element 121 is connected to the input signal line. One of the input terminals of the NAND gate is connected to the memory element 122 with the other connected to the input signal line. The output terminal of the NAND gate is connected to the gate of the P channel FET 124. The power source voltage VDD is applied to the source of the P channel FET 124, and the drain of the P channel FET 124 is connected to the output signal line.

The delay circuit 120 shown in FIG. 22 (3) comprises a delay element 121, a memory element 122, an inverter 125, a NAND gate 126, and a P channel FET 124. The input terminal of the inverter 125 is connected to the input signal. The first input terminal of the NAND gate 126 is connected to the memory element 122 while the second input is connected to the input terminal of the inverter 125. The third input terminal of the NAND gate is connected to the output terminal of the inverter 125. The delay circuit 120 can output a pulse signal having a short pulse width.

The matrix form of the delay circuit 120, shown in FIG. 22 (1), each comprising a memory element 122 express the shape of the waveform along the time axis and amplitude of the waveform. This means that the output signal from the delay circuit 120 which is positioned on the right side the matrix has a longer delay duration. The number of delay circuits 120 outputting the signal "1" in each of the columns in the matrix determines the amplitude of the waveform.

The waveform generation circuit of this embodiment can generate an arbitrary waveform by storing desired waveform patterns to the matrix formed memory elements in a visual way.

Tenth Embodiment

Figure 23:
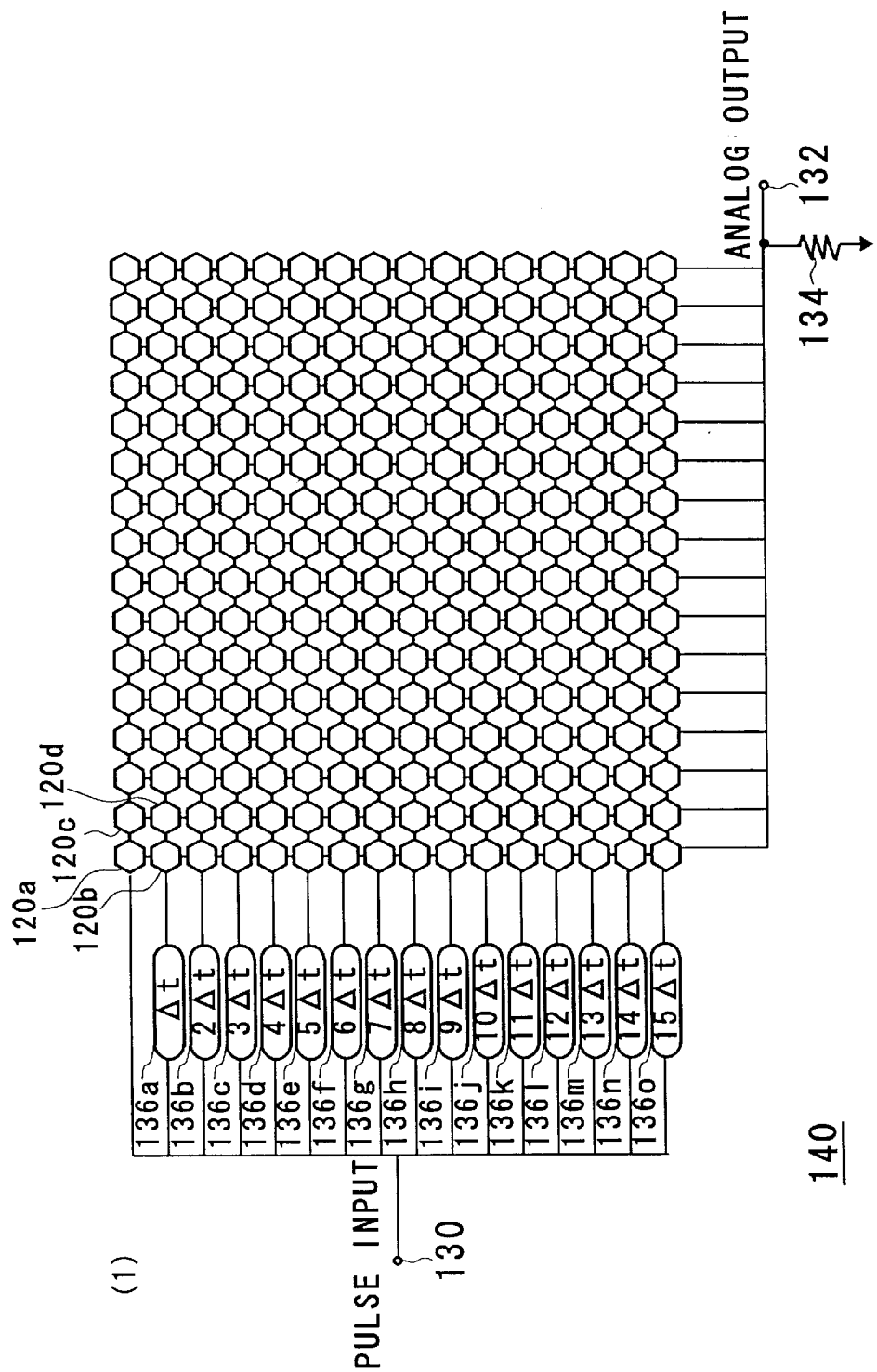
FIG. 23 is a circuit diagram of a waveform generation circuit of a tenth embodiment of the arbitrary waveform generator according to the present invention.

The tenth embodiment of the arbitrary waveform generator according to the present invention will be explained with reference to FIGS. 23 and 24. FIG. 23 is a circuit diagram of the waveform generation circuit 140 of the waveform generator of the tenth embodiment.

The waveform generation circuit 140 of this embodiment is comprised of many delay circuits arranged in a matrix form as shown in FIGS. 22 (2) and 22 (3). The delay circuits 120a, 120b, 120c and 120d are shown in FIG. 23. The rows of the delay circuits 120 in the matrix form are connected with each other through the input signal line. The columns of the delay circuits 120 in the matrix form are connected with each other through the output signal line. The input signal lines are connected to the input terminal 130 and the output signal lines are connected to the output terminal 132. The output terminal 132 is connected to the ground via a resistance 134.

The delay circuits in each row are connected with each other through the input signal line and compose the waveform generation circuit 16 shown in FIGS. 3 to 17. The waveform generation circuit 140 comprises a plurality of waveform generation circuits 16 connected in a parallel relationship with each other to the input terminal 130. In the delay circuit 120, the delay element 121 shown in FIG. 22 (2) delays the propagation of the input signal for delay duration T. The object of this embodiment is to provide a waveform generation circuit capable of generating a waveform with a shorter time resolution than the delay duration T of the delay element 121.

The waveform generation circuit 140 is comprised of minute delay elements 136a to 136o each provided between the input terminal and each of the first delay elements. The minute delay element 136a delays the propagation Of the input signal for delay duration $\Delta t$, and the minute delay element 136b delays the propagation of the input signal for delay duration $2\Delta t$. Each of the minute delay elements 136c, 136d, ... 136o delays the propagation of the input signal for delay duration $\Delta 3t, \Delta 4t, \ldots \Delta 15t$. In this actual embodiment, $\Delta t$ is equal to $\Delta T/16$, where $\Delta T$ is a delay duration of the delay element 121. By providing the minute delay elements 136a to 136o, the waveform generation circuit 140 can generate the waveform having time resolution $\Delta t$, which is $\frac{1}{16}$ of the delay duration $\Delta T$ of the delay element 121.

The waveform generation circuits composing the waveform generation circuit 140 generates waveforms whose phases are successively shifted for $\Delta t$ to $\Delta 15t$. Again, the result is the waveform generation circuit 140 can generate a waveform having time resolution $\Delta t$, which is $\frac{1}{16}$ of the delay duration $\Delta T$ of the delay element 121.

Figure 24:
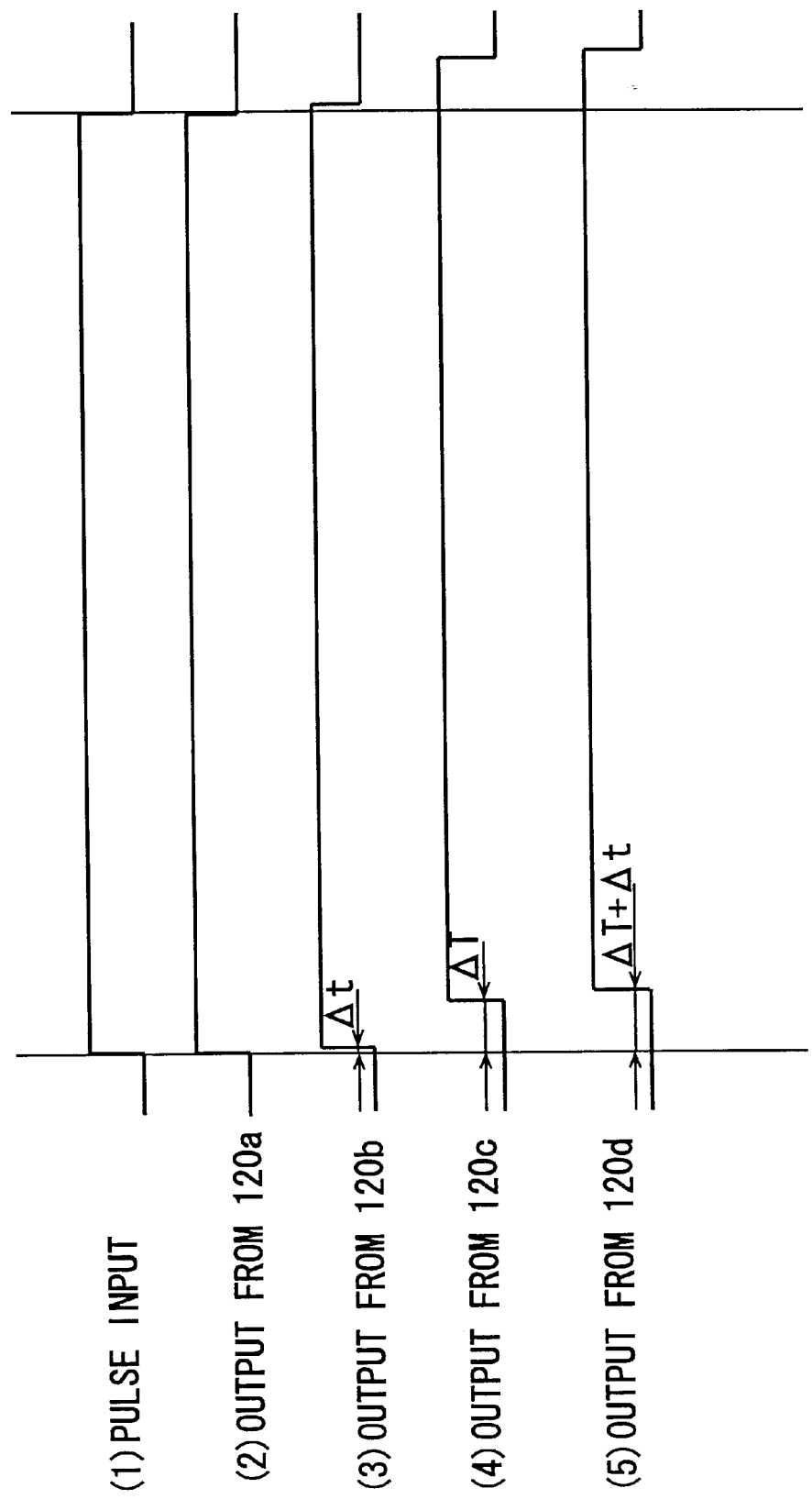
FIG. 24 shows examples of waveforms generated by circuit elements 120a, 120b, 120c and 120d, a tenth embodiment of the waveform generator according to the present invention.

FIG. 24 shows the output signals output from the delay circuits 120a, 120b, 120c and 120d of this embodiment. It is assumed that the memory elements 122 (see FIGS. 22 (2) and 22 (3)) of each of the delay circuits 120a, 120b, 120c and 120d store "1". The delay circuits 120a and 120b respectively outputs the input pulse which does not pass through the delay element 121 in the waveform generation circuit. The delay circuits 120c and 120d respectively output the input pulse which has passed through one delay element 121 in the waveform generation circuit. As shown in FIG. 23, there is no minute delay element between the input terminal and the first row of the delay circuits including the delay circuits 120a and 120b. In contrast, there is a minute delay element 136a having delay duration $\Delta t$ between the input terminal and the second row of the delay circuits including the delay circuits 120c and 120d. The delay circuits 120a to 120d are constructed as shown in FIG. 22 (2), but the delay circuits 120a and 120b do not have the delay element 121.

FIG. 24 (1) shows an input pulse which is input to the input terminal 130.

FIG. 24 (2) shows an output pulse from the delay circuit 120a. The delay circuit 120a does not contain the delay element 121 nor the minute delay elements. The result is that the output waveform from the delay circuit 120a becomes the same as the signal waveform of the input pulse.

FIG. 24 (3) shows an output waveform from the delay circuit 120b. As described above, the delay circuit 120b does not contain the delay element 121. The output waveform from the delay circuit 120b is therefore not delayed by the delay element 121, but is delayed by the minute delay element 136a for delay duration $\Delta t$.

FIG. 24 (4) shows an output waveform from the delay circuit 120c. The delay circuit 120c contains the delay element 121. The output waveform from the delay circuit 120c is therefore delayed for delay duration $\Delta T$.

FIG. 24 (5) shows an output waveform output from the delay circuit 120d. The delay circuit 120d contains the delay element 121. The output waveform from the delay circuit 120d is therefore delayed for delay duration $(\Delta T + \Delta t)$.

Although the first and second rows of the waveform generation circuits are explained above, the remainder of the rows of the waveform generation circuits can generate delayed waveforms due to the provision of minute delay elements (136a to 136o). For example, the minute delay element 136h delays the propagation of the input pulse for delay duration $8\Delta t$, and the minute delay element 136o delays the propagation of the input pulse for delay duration $15\Delta t$. Therefore, the delay circuit in the row of the waveform generation circuit connected to the minute delay element 136h outputs an output signal which is delayed for $(\Delta T \times \text{integer} + 8\Delta t)$. In a similar manner, the delay circuit in the row of the waveform generation circuit connected to the minute delay element 136o outputs an output signal which is delayed for $(\Delta T \times \text{integer} + 15\Delta t)$.

In this actual example, the delay circuit 120 is constructed as shown in FIG. 22 (2). The delay circuit 120 may also be constructed as shown in FIG. 22 (3) in another actual example. In this case, each of the delay circuits output a pulse signal having a short pulse width.

As described above, the tenth embodiment according to the present invention can provide the waveform generation circuit 140 which is capable of generating an arbitrary waveform having a short time resolution. This means that the waveform generation circuit 140 is capable of generating a desired waveform having a time resolution $\Delta t$.

Figure 25:
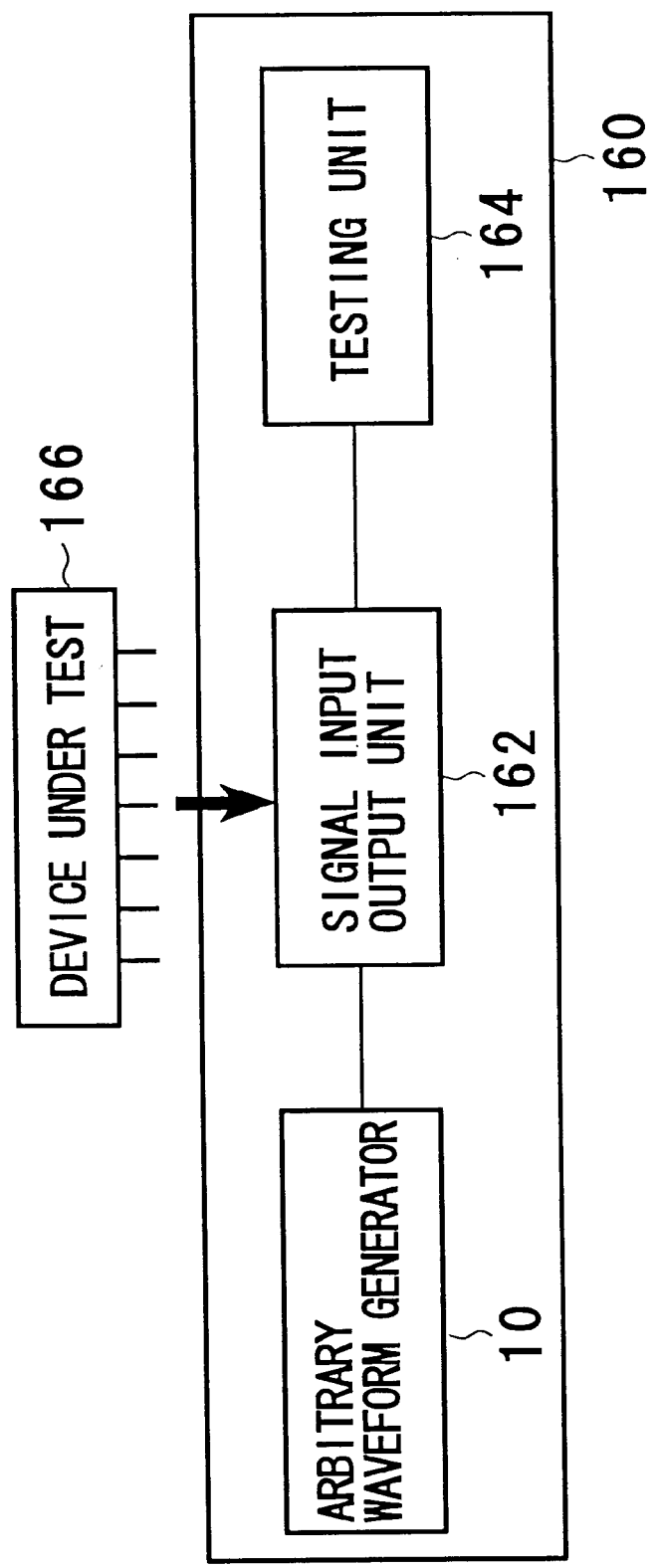
FIG. 25 is a block diagram of a semiconductor testing device 160.

FIG. 25 is a block diagram of a semiconductor testing device 160 used for testing a device under test 166. The semiconductor testing device 160 is comprised of an arbitrary waveform generator 10, a signal input and output unit, and a testing unit 164. The arbitrary waveform generator 10 corresponds to the arbitrary waveform generator shown in FIG. 3 and comprises a waveform generation circuit capable of generating an arbitrary waveform. The waveform generation circuit corresponds to one of the waveform generation circuits 16, 100, 110 and 140.

The waveform generation circuit included in the arbitrary waveform generator 10 is capable of generating a waveform of test signal for testing devices under test 166. The arbitrary waveform generator 10 supplies the test signal to the signal input and output unit 162. The device under test 166 is electrically connected to the signal input and output unit 162. The signal input and output unit 162 supplies the test signal to the device under test 166. The device under test 166 outputs a device output signal on the basis of the input test signal and supplies the device output signal to the signal input and output unit 162. The signal input and output unit 162 accept the device output signal and supplies it to the testing unit 164. The testing unit judges whether the device output signal shows a normal response from the device under test, based on this output signal. When the testing unit judges that the device output signal shows a normal response, the testing unit judges that the device under test 166 is qualified. When, on the other hand, the testing unit judges that the device output signal shows an abnormal response, the testing unit judges that the device under test 166 is not qualified. The testing unit.164 can test the quality of the device under test 166.

Figure 26:
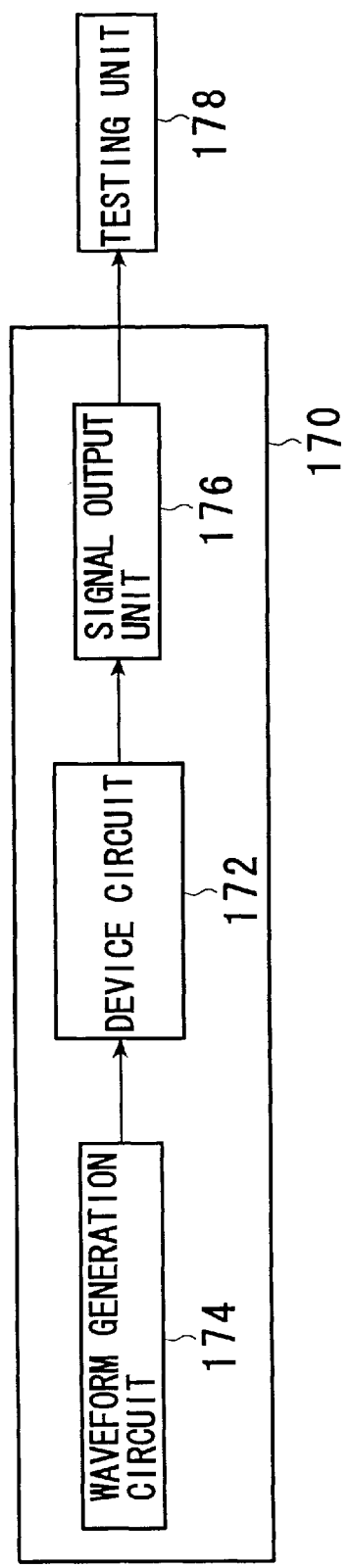
FIG. 26 is a block diagram of a semiconductor device 170 including a waveform generation circuit 174 according to the present invention.

FIG. 26 is a block diagram of a semiconductor device 170 including a waveform generation circuit 174 according to the present invention. The semiconductor device 170 comprises a waveform generation circuit 174, a device circuit 172, and a signal output unit 176 . It has a built in self test element which is capable of self testing its quality. The device circuit 172 is a circuit constructed to actualize a predetermined function as an analog element. The waveform generation circuit 174 corresponds to the waveform generation circuits 16, 100, 110, and 140. The semiconductor device 170 is because it includes the waveform generation circuit 174 according to the present invention.

The waveform generation circuit 174 is capable of outputting a waveform of arbitrary test signals for testing the device circuit 172, based on the input signal provided. The input signal may be a clock signal. The test signal is input to the device circuit 172. The device circuit 172 produces a device output signal in response to the input test signal. The device output signal is supplied to the signal output unit 176. The signal output unit 176 is capable of converting the device output signal to a signal which is easily processed in the testing unit 178 provided outside of the semiconductor device 170. The signal output unit may be an under sample circuit, for example, and converts an output signal having high frequency to a signal having low frequency. The signal converted in the signal output unit 176 is then supplied to the testing unit 178. The testing unit 178 accepts the converted signal and judges whether the response from the device circuit is normal or abnormal. The quality of the device circuit 172 of the semiconductor device 170 is determined by the judgement of the testing unit 178.

The semiconductor device 170 can test a high-speed response from the device under test by including the interior waveform generation circuit 174 according to the present invention. The waveform generation circuit 174 according to the present invention has extremely short time resolution, thereby making it possible to perform extremely precise tests.

Other Embodiment

Various alternation may be provided to the present invention in addition to the above described embodiments. For example, the processing circuit may be any circuit capable of processing the input data on the basis of the stored data.

The current supply circuit may be any circuit in addition to that of the above described embodiment. Although the current value supplied by the current supply circuit to each of the processing circuits are equal in the above described embodiments, the current value supplied to each of the processing circuits may be different. The circuits capable of generating short pulses may have any composition in addition to the above described embodiments.

The waveform generator according to the present invention may be applied to any electronic device using arbitrary waveforms. More particularly, the waveform generator according to the present invention may be applied to device testing apparatus when the desire is to test the device using arbitrary waveforms.

According to the present invention, there is provided a waveform generator capable of generating a waveform having short time resolution, a semiconductor testing device and a semiconductor device including the waveform generator. While several illustrative embodiments have been explained, the scope of the present invention is not limited to the above embodiments. It is possible that those skilled in:the art might make variations and alternations to the above embodiments. It is clear that those variations and alternations to the above embodiments are included in the scope of the invention as defined in the appended claims.

As described above, a waveform generator comprises a plurality of delay means cascaded with each other for delaying the propagation of the input signal. It also contains numerous memory components provided between each of the delay means for storing data for generating the waveform, as well as a plurality of processing means for processing the input data on the basis of the data stored in each of the memory. The waveform generator composes the output signals from each of the processing means to generate a waveform in accordance with the data. The result is, an arbitrary waveform having a short time resolution and a precise shape can be generated.

What is claimed is:

1. A waveform generator for generating a waveform signal for a semiconductor testing device, comprising:

an input terminal to which an input signal is input;

a delay unit having a plurality of delay elements each delaying propagation of said input signal to output a delayed input signal, said delay elements being cascaded with each other;

a processing unit having a plurality of processing circuits each connecting to an input of said respective delay elements for outputting an output signal based on each of said delayed input signal input thereto;

a signal line connecting to outputs of the plurality of processing circuits for composing said output signals output from each of said processing circuits of said processing unit to generate a waveform signal; and a plurality of memory for storing data, each of said plurality of memory respectively being connected to each of said plurality of processing circuits, and each of said processing circuits outputting said output signal on the basis of said data stored in each of said memory.

2. A waveform generator as set forth in claim 1, further comprising:

a plurality of said delay unit, each connected to said input terminal in parallel relationship with each other; and a plurality of said processing unit, each correspondingly provided to each of said plurality of delay units.

3. A waveform generator as set forth in claim 2, further comprising a plurality of minute delay elements each provided between said input terminal and said first delay element of each of said delay units, said minute delay element having a smaller delay duration than that of said delay elements.

4. A waveform generator as set forth in claim 1, wherein said signal line adds said output signals from each of said processing circuits to give an additional value and generates said waveform signal on the basis of said additional value.

5. A waveform generator as set forth in claim 1, wherein said processing unit comprises a first processing circuit to which said input signal input to said input terminal is input.

6. A waveform generator as set forth in claim 1, wherein each of said processing circuits either directly outputs said delayed input signal or outputs after reversing said delayed input signal as said output signal on the basis of said data.

7. A waveform generator as set forth in claim 1, wherein said memory stores a plurality of data for generating said waveform signal, and said processing circuit outputs said output signal on the basis of said plurality of data stored in said memory so that said waveform signal generated comprises a longer period wave than said input signal.

8. A waveform generator as set forth in claim 7, further comprising a data control unit for controlling said plurality of data for generating said waveform signal to be output at a predetermined interval, said processing circuit outputting said output signal on the basis of said data output by said data control unit.

9. A waveform generator as set forth in claim 1, wherein each of said processing circuits outputs current corresponding to said output signal.

10. The waveform generator as set forth in claim 9, wherein said signal line composes said output signal from each of said processing circuits to generate said waveform signal having a value corresponding to the number of said processing circuits.

11. A waveform generator as set forth in claim 1, wherein each of said processing circuits comprises a current supply circuit for supplying current on the basis of said output signal and a reverse signal of said output signal.

12. A waveform generator as set forth in claim 1, further comprising a minute delay element provided between said input terminal and said first delay element of said delay unit, said minute delay element having a smaller delay duration than that of said delay element.

13. A semiconductor testing device for testing a device comprising:
  a waveform generator for generating on the basis of an input signal, a test signal to be input to said device under test;
  a signal input and output unit for supplying said test signal to said device under test and accepting a device output signal from said device under test on the basis of said test signal; and
  a testing unit for testing the quality of said device under test on the basis of said device output signal accepted by said signal input and output unit;
  wherein said waveform generator comprises:
    an input terminal to which an input signal is input;
    a delay unit having a plurality of delay elements for delaying propagation of said input signal to output a delayed input signal, said delay elements being cascaded with each other;
    a processing unit having a plurality of processing circuits, each of said processing means outputting an output signal based on each of said delayed input signals thereto; and
    a signal line for composing said output signals from each of said processing circuits of said processing unit to generate a waveform of said test signal.

14. A semiconductor testing device as set forth in claim 13, wherein said waveform generator further comprises:
  a plurality of said delay unit, each connected to said input terminal in parallel relationship with each other; and
  a plurality of said processing unit, each correspondingly provided to each of said plurality of delay units.

15. A semiconductor testing device as set forth in claim 13, wherein said signal line adds said output signals from each of said processing circuits to give an additional value, and generates said waveform on the basis of said additional value.

16. A semiconductor testing device as set forth in claim 13, wherein said waveform generator further comprises a plurality of memory for storing data for generating said waveform, each of said plurality of memory respectively being connected to each of said plurality of processing circuits, each of said processing circuits outputting said output signal on the basis of said data stored in each of said memory.

17. A semiconductor device having self-testing ability comprising:
  a circuit constructed to actualize a predetermined function;
  a waveform generation circuit for generating a test signal to be input to said circuit; and
  a signal output unit for outputting a device output signal from said circuit on the basis of said test signal, to the external of said semiconductor device;
  wherein said waveform generation circuit comprises:
    a delay unit having a plurality of delay elements for delaying the propagation of an input signal to output a delayed input signal, said delay elements being cascaded with each other;
    a processing unit having a plurality of processing circuits, each of said processing circuits outputting an output signal based on each of said delayed input signals input thereto; and
    a signal line for composing said output signals from each of said processing circuits of said processing unit to generate a waveform of said test signal.

18. A semiconductor device as set forth in claim 17, wherein said waveform generation circuit comprises:
  a plurality of said delay unit, each connected in parallel relationship with each other; and
  a plurality of said processing unit, each correspondingly provided to each of said plurality of delay units.

19. A semiconductor device as set forth in claim 17, wherein said composing unit adds said output signals from each of said processing circuits to give additional value and generates said waveform on the basis of said additional value.

20. A semiconductor device as set forth in claim 17, wherein said waveform generation circuit further comprises a plurality of memory for storing data for generating said waveform, where each of said plurality of memory is connected to each of the respective said plurality of processing circuits, and each of said processing circuit outputting said output signal on the basis of said data stored in each of said memory.

21. A waveform generator generating a waveform signal from an input signal, the waveform generator generating a waveform signal for a semiconductor testing device, said waveform generator operated with a clock device supplying a clock signal, comprising:

an input terminal;

a plurality of delay elements connected in series to each other, said input terminal connected to an input of a first delay element for outputting the clock signal delayed by a predetermined time into a second delay element; and a plurality of memory elements each selectively connected to an output terminal of the waveform generator according to the delayed clock signal, each of said memory elements storing a particular component of the input signal and outputting said particular component when connected to said output terminal.

* * * * *